United States Patent [19]

Burns et al.

[11] 4,155,041
[45] May 15, 1979

[54] SYSTEM FOR REDUCING NOISE TRANSIENTS

[76] Inventors: Richard C. Burns, 216 Stratford St., Syracuse, N.Y. 13210; Thomas N. Packard, 4871 McDonald Rd., Syracuse, N.Y. 13215

[21] Appl. No.: 686,107

[22] Filed: May 13, 1976

[51] Int. Cl.² ............... H04B 7/02; H04B 15/00; H04B 1/06; H04B 1/10
[52] U.S. Cl. ............... 325/56; 325/65; 325/371; 325/474; 360/38; 179/1 P
[58] Field of Search ............... 325/56, 301, 304, 371, 325/474, 477, 397, 398, 400, 425, 59, 302, 303, 478, 65, 473, 475, 476, 370; 360/22, 38; 179/1 P; 307/233 R, 355, 362; 328/33, 154, 165; 170/179 E

[56] References Cited

U.S. PATENT DOCUMENTS

| | | | |
|---|---|---|---|
| 2,261,951 | 11/1941 | Bloch | 325/474 |
| 2,604,587 | 7/1952 | Lyons | 325/304 |
| 2,775,693 | 12/1956 | Berwin | 325/304 X |
| 2,968,718 | 1/1961 | McKesson | 325/56 |
| 3,401,340 | 9/1968 | Cronburg, Jr. et al. | 325/304 |
| 3,475,686 | 10/1969 | Holt, Jr. et al. | 325/304 |
| 3,588,705 | 6/1971 | Loch et al. | 325/482 X |
| 3,613,012 | 10/1971 | Feistel | 325/474 |
| 3,670,275 | 6/1972 | Kalliomaki et al. | 325/370 |
| 3,729,681 | 4/1973 | Elder | 325/302 X |
| 3,800,164 | 3/1974 | Miller | 328/147 X |
| 3,803,496 | 4/1974 | Groen | 325/477 X |
| 3,904,968 | 9/1975 | Brinegar | 325/477 X |
| 3,978,412 | 8/1976 | Frerking | 325/474 X |
| 3,989,897 | 11/1976 | Carver | 325/65 X |
| 3,997,844 | 12/1976 | Jayant | 325/56 |
| 4,030,040 | 6/1977 | Harbert | 325/302 X |
| 4,035,729 | 7/1977 | Perry | 325/478 X |
| 4,039,953 | 8/1977 | Chadwick | 325/304 |

FOREIGN PATENT DOCUMENTS 603057 8/1960 Canada .................................. 360/38

Primary Examiner—Richard Murray
Assistant Examiner—Aristotelis M. Psitos
Attorney, Agent, or Firm—D. Peter Hochberg

[57] ABSTRACT

A system for reducing noise transients in identical electrical carrier signals carried simultaneously over separate channels, comprising means for comparing the noise transients in the respective channels and for transmitting the carrier signal in the channel having the lowest noise transient. The system can comprise means for blanking at least a portion of a carrier signal whose noise transient level exceeds a predetermined value.

42 Claims, 20 Drawing Figures

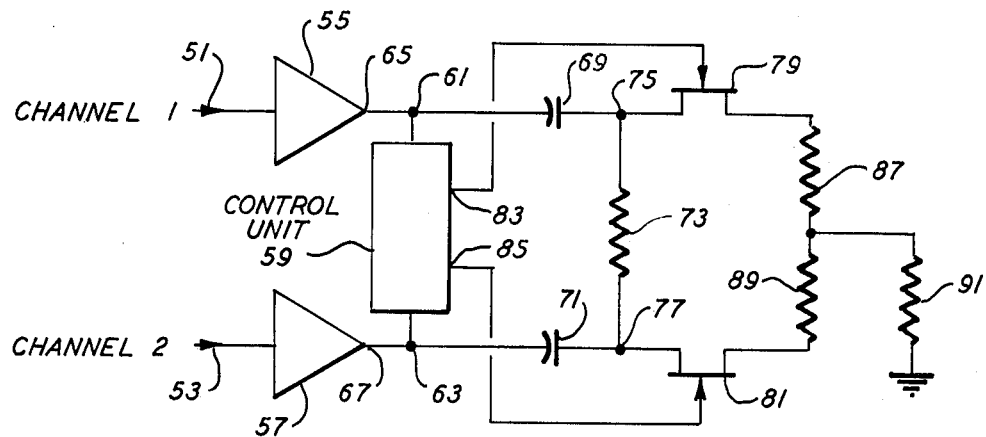
_FIG. 2_
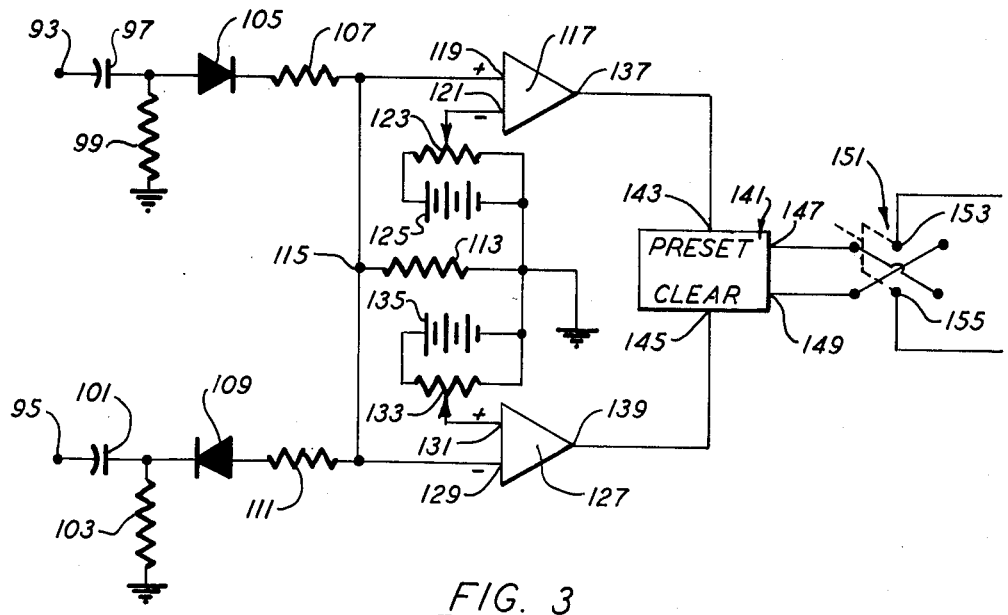
_FIG. 3_

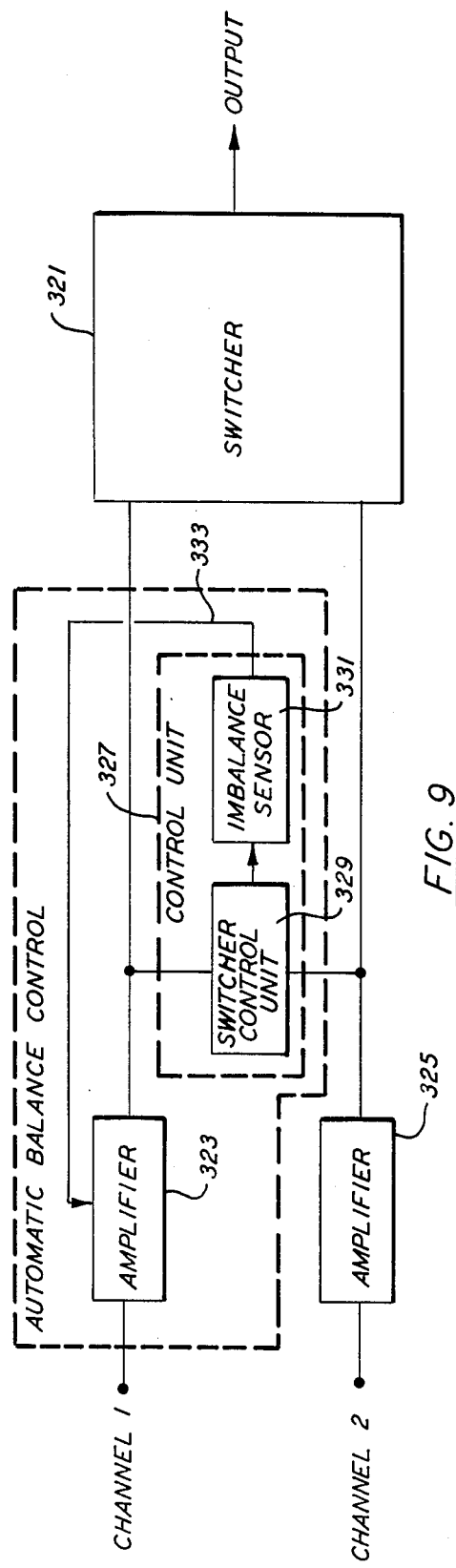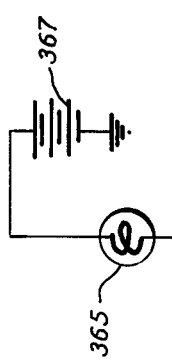

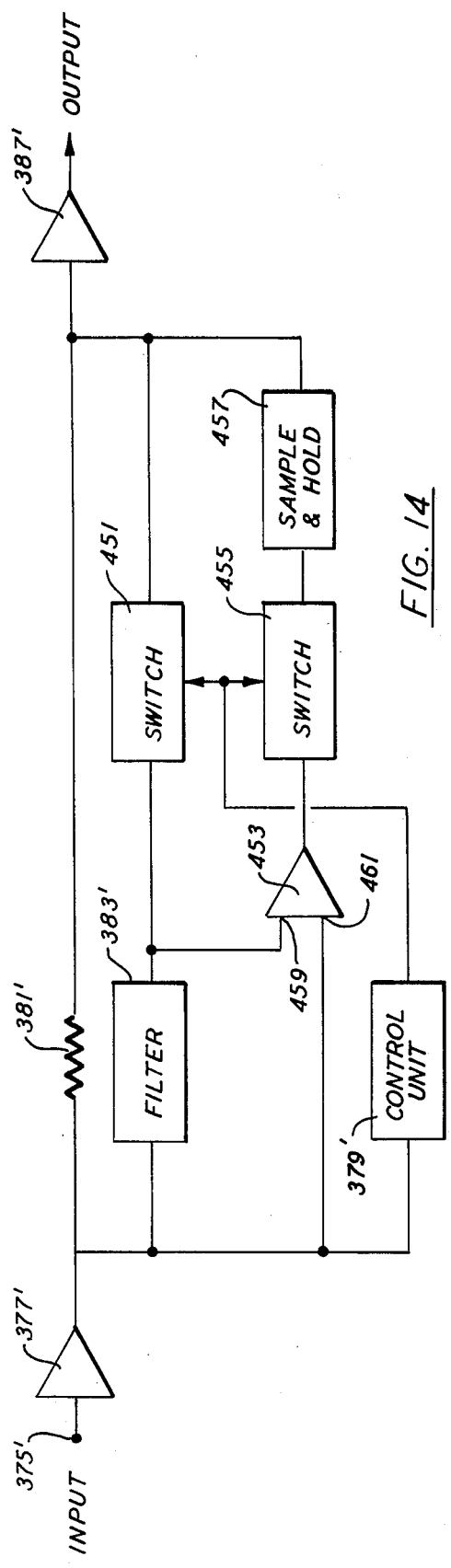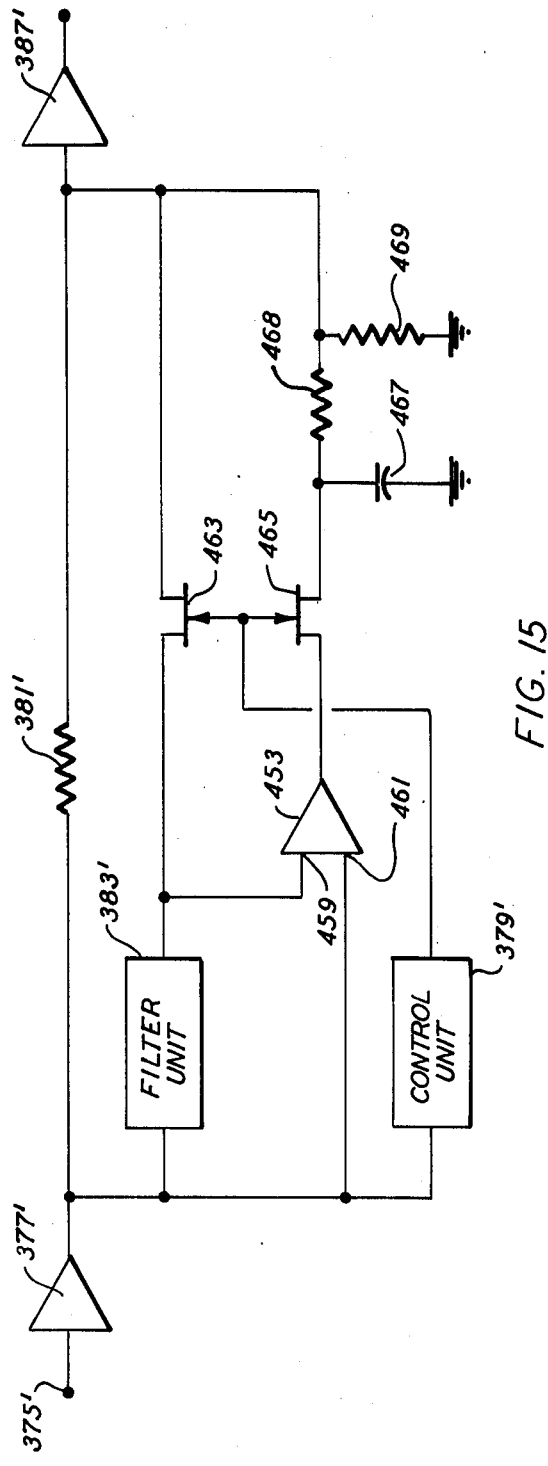
FIG. 14
FIG. 15

SYSTEM FOR REDUCING NOISE TRANSIENTS

BACKGROUND OF THE INVENTION

1. Field of the Invention

The present invention relates to the transmission of electrical carrier signals, and to the recording and reproduction of sound, and in particular to the reproduction, and the rerecording and playback, of previously recorded sound signals.

2. Description of the Prior Art

In playing back a sound recording, one hears not only a reproduction of the original signal, but also the undesirable extraneous noise components that are caused by imperfections in the original recording and in the storage medium, damage to the storage medium, and inherent defects inadvertently introduced by the metal parts used in the manufacture of the storage medium. Such noises are commonly designated by such terms as "surface noise", "crackle", "ticks", etc. These noises are generally of a first type of an audibly continuous nature distributed fairly uniformly throughout the audio frequency range and known as "white" noise, and of a second type which are transient sounds of short duration and high amplitude relative to the signal.

Radio broadcast signals also may contain some additional noise components caused by disturbances in the transmission or reception, commonly called "static". Static, also, typically consists of pulses of short duration and high amplitude.

The development of two-channel stereophonic record playing equipment makes it possible to play back monophonic disc or cylinder recordings, of either the vertical-cut or the lateralcut type, in such a manner that one channel or the reproduction system reproduces, essentially, from one wall of the groove, and the other channel of the reproduction reproduces, essentially, from the other wall of the groove, both walls of the groove bearing the identical recorded carrier signal.

However, such factors as imperfections in the record material, defects in manufacture, damage, dirt, wear, mildew, etc. which may introduce transient noises into the reproduction of the recording, will not be identical on opposite sides of the record groove. Therefore, in reproducing a monophonic recording with stereophonic playback equipment, the carrier signal will be identical in both channels, save for such effects introduced in playback such as tracing error, tracking error and "pinch effect" that turn out in the application of this invention, to be of a second order nature, whereas noise transients will be different in the two channels.

Previous processes in reducing unwanted noises in sound reproduction have relied on restricting the frequency range as far as is feasible for the purpose or application. Typically, the higher frequency components of the noise, usually referred to by such terms as "surface noises", "crackle", "ticks", etc. are suppressed throughout the playback, usually at some sacrifice to the fidelity of reproduction of the recorded signal. Some sophistication in this process was introduced by Harmon H. Scott whose Dynamic Noise Suppressor used electronic means automatically to alter the frequency pass band width in record reproduction in accordance with the loudness of the music. The Scott Suppressor takes advantage of the phenomena that the relative sensitivity of the ear to various frequencies varies with the loudness of the sound, and that louder passages of music and other audio signals have a correspondingly improved masking effect on the surface noise perceived from the recording; so that, in louder passages a wider frequency range is feasible in reproduction than is the case in the reproduction of the quieter passages for similar listening comfort and perceived tone quality. The operation of the Dynamic Noise Suppressor is, basically, a rather gradual one, especially in closing down the frequency range after loud passages, lest a too-evident change in background noise become audible. The Dynamic Noise Suppressor is incapable of suppressing transient noises save in a generalized manner by its relatively long-term modification of the pass band; it copes much more successfully with continuous "white" noise than with noises of a more pronouncedly transient nature. These same observations apply to such recent developments and extensions of the Scott principle as are embodied in U.S. Pat. Nos. 3,678,416 (Burwen) and 3,803,357 (Sachs). A different method of subjectively reducing surface noise is described in U.S. Pat. No. 3,275,326 (Welsh), in which two identical recordings playing simultaneously are auditioned.

Compressor-expander systems are well known in the art of sound recording and reproduction. These systems function by compressing the dynamic range in the recording process, and by expanding the dynamic range in the playback process to the extent it was compressed. The following U.S. Pat. Nos. disclose various compressor-expander systems: 3,665,345 (Dolby), 3,729,693 (Dolby), 3,732,371 (Burwen), 3,813,559 (DeBoer), 3,815,039 (Fujisawa), 3,828,280 (Dolby), 3,829,715 (VanSluys), and 3,846,719 (Dolby). The systems are only effective for reducing noise in those sound recordings which are specifically pre-encoded for such systems.

Other assorted noise and signal reduction systems are disclosed in U.S. Pat. Nos. 2,736,771 (Hanson), 2,912,571 (Jacobsen), 3,171,901 (Clemency), 3,394,235 (Schott), and 3,896,465 (Kaizu).

SUMMARY OF THE INVENTION

It is a general object of the present invention to eliminate noise transients from sound signals.

A further object of the invention is to provide apparatus for conomically and effectively removing noise transients from sound signals. Yet another object is to provide improved apparatus for suppressing noise transients from sound signals emanating from such sources as phonograph recordings, optical film recordings, sound tapes, and other sound signal carriers.

The foregoing objects are achieved according to the invention by a process of eliminating or suppressing individual noise transients by a first step that shall be designated as "switching" and, by a second step that shall be designated as "blanking". Where the criteria do not exist for the performance of the switching step, the blanking step, alone, can be used.

In removing noise components from a monophonic disc or cylinder recording according to the invention, the original monophonic recording is played back on a two-channel stereophonic playback. Apparatus according to a preferred embodiment of the invention includes means for detecting the channel in which the noise transient has the lesser amplitude at the point of occurrence of the noise transient, and for rapidly switching to choose the "quieter" channel for reproduction. Although primarily conceived for playing back single recordings, the foregoing switching step is applicable also to all forms of retrieval of an identical signal from two or more separate sources that differ in their noise content. Thus, it is applicable to two or more copies of the same recording played concurrently in synchronism, either before or after reprocessing by either or both the switching and blanking steps. The switching step is applicable, also, to two or more different recordings of an identical radio broadcast, played concurrently in synchronism, that differ in their noise content.

The blanking step can follow the switching step, to eliminate or suppress noise transienets that may remain after the switching step has concluded, as well as noise transienets from signal sources to which the switching step is not applicable or effective.

The blanking apparatus detects noise transients, and in response thereto briefly inserts a band elimination filter in the signal circuit, such that the audibility of the noise transient is eliminated or greatly reduced. The manner of operation of the blanking step and its time duration have been so devised that the blanking does not add an appreciable audible signal.

Further objects and features of the invention will be apparent from the following description and the appended claims.

BRIEF DESCRIPTION OF THE DRAWINGS

FIG. 2 is an illustration of circuitry which can be used in the system of FIG. 1;

FIG. 3 shows a control unit for use in circuits illustrated in FIGS. 1 and 2;

FIG. 4 shows in schematic form a modification of the system shown in FIG. 1;

FIG. 9 is a schematic of an automatic balance control circuit for use with the circuits of FIGS. 1, 4, and 5;

FIG. 10 shows a circuit which can be used as the circuit shown schematically in FIG. 9;

FIG. 14 illustrates an alternate blanking system to that shown in FIG. 11;

FIG. 15 shows the details of a circuit according to FIG. 14;

DESCRIPTION OF THE PREFERRED EMBODIMENTS

The present invention provides a process and apparatus for removing undesirable noise of a transient nature from sound signals emanating from such sources as sound recordings, radio broadcasts, and the like. The basic process of the invention includes two steps - a switching step and a blanking step. The switching step is applicable to a two-channel input wherein substantially identical carrier signals are received simultaneously, and appropriate electronic circuitry compares the noise transients in the carrier signals in the channels and selects that channel having the lower noise components for transmission to the recording or reproducing apparatus. The blanking step can follow the switching step or can operate independently thereof, and in effect institutes a short duration blank when those noise components exceed a predetermined level. The apparatus according to the invention comprises electronic circuitry for effecting the foregoing steps. The switching and blanking steps and the apparatus for effecting the same, are not restricted to a two-channel input but can be adapted to any number of channels.

Figure 1:
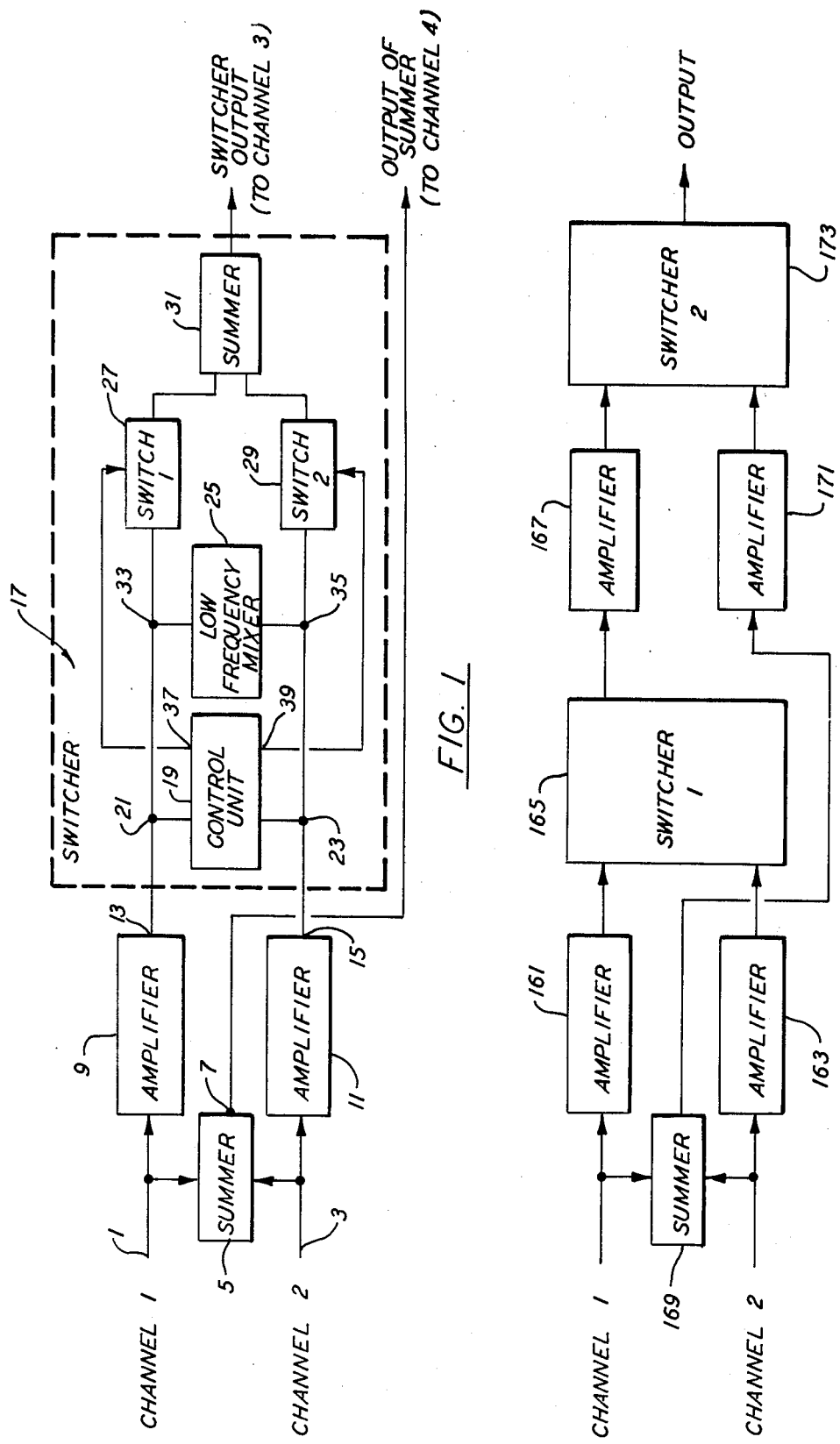
FIG. 1 is a schematic drawing of a system for performing the switching function according to the invention.

Referring now to FIG. 1, there is illustrated a switching device or circuit which includes two input channels designated as Channel 1 and Channel 2. The input terminal of Channel 1 is indicated by numeral 1 and the input terminal of Channel 2 is designated by the numeral 3. A summer 5 is connected between Channels 1 and 2 and has an output terminal 7. Channels 1 and 2 lead respectively to amplifiers 9 and 11. Amplifiers 9 and 11 have output terminals 13 and 15 from which leads run to comparing means in the form of a switcher 17. Switcher 17 includes a control unit 19 connected at terminals 21 and 23 between the parallel lines from amplifier terminals 13 and 15. A low frequency mixer 25 is connected in parallel with control unit 19 between the parallel output lines of amplifiers 9 and 11, which output lines are connected respectively to a first switch 27 and a second switch 29. Switcher 17 further includes a summer 31 connected to switches 27 and 29, and the output of summer device 31 is also the output of switches 17. For the purposes of this description, Channels 1 and 2 are presumed to be the two channels of a stereophonic playback cartridge, although these channels can be the output of any simultaneously recorded sound signal. These two channels are connected to the carrier signal sources such that the instantaneous voltages in each are of the same polarity.

Signals on Channels 1 and 2 are applied to amplifiers 9 and 11. Means are provided, as explained hereinafter, for adjusting the gains of the two amplifiers so that their outputs in response to input signals without noise are substantially equal in magnitude and phase. The outputs of amplifiers 9 and 11 are applied to the input terminals 21 and 23 of control unit 19 and to low frequency mixer 25. Low frequency mixer 25 mixes the low frequency components of the outputs of amplifiers 9 and 11 so that they are equal at terminals 33 and 35 to which mixer 25 is connected. Switches 27 and 29 are preferably fast acting switches operated by control unit 19, which applies a voltage through one or the other of its output terminals 37 or 39 to actuate and close only one of the two stitches 27 and 29 at any time. Control unit 19 selects the switch to be actuated according to which channel has the lesser instantaneous absolute voltage, which corresponds to the lesser amount of transient noise. Control unit 19 only responds in the foregoing manner to high frequency signals, the lower frequency componenets being in effect not switched since the low frequency mixer 25 has made the low frequency componenets equal on each channel prior to the switching operation, and at the input terminals 21, 23 of the control unit.

FIG. 2 shows componenets which can be used in the switcher incorporated in the apparatus of FIG. 1. The circuitry of FIG. 2 includes input terminals 51 and 53 of Channels 1 and 2, respectively, which lead to amplifiers 55 and 57. No summer is incorporated in the apparatus of FIG. 2, although such a unit could be included as explained below. A control unit 59 is connected at junctures 61 and 63 to the lines leading from the output terminals 65 and 67 of amplifiers 55 and 57. The low frequency mixer corresponding to component 25 in FIG. 1, comprises capacitors 69 and 71 in the output lines of amplifiers 55 and 57, and a resistor 73 bridged across capacitors 69 and 71. This arrangement assures that the low frequency componenets of signals transmitted through the switcher will be identical at junctures 75 and 77 corresponding to junctures 33 and 35 in FIG. 1. The preceding arrangement is particularly suitable for an anticipated crossover frequency of approximately 300 Hz. A pair of fastacting switches 79 and 81, which can be high speed field effect transistors, are connected across opposite ends of resistor 73, and operatively connected to output terminals 83 and 85 of control unit 59. Resistors 87 and 89 are respectively connected to switches 79 and 81, and a third resistor 91 is connected between the juncture of the latter resistors and ground. Resistors 87-91 collectively comprise a summer corresponding to summer 31 in FIG. 1. Control unit 59 alternatively transmits a signal from terminals 83 or 85 to close either switch 79 or 81. The selection of one or the other of switches 79 and 81 determines from which of the two channels the output signal will be transmitted. Control unit 59 selectively closes the switch 79 or 81 in the channel having the lowest transient noise level at any instant, to cause the signal in the quietest channel to transmit the output signal at each instant. The switching arrangement in the circuitry of FIG. 2 thus provides that the higher frequency componenets of input signals are transmitted over the channel having the lower instantaneous noise level; the lower frequency componenets of the input signal are effectively not switched since the low frequency mixer has equalized the low frequency components prior to the switching function.

A control unit suitable for incorporation in the apparatus of FIGS. 1 or 2 is shown in FIG. 3. The Channel 1 inlet terminal is designated by the numeral 93 and the Channel 2 inlet terminal is designated by the numeral 95. As mentioned previously, aside from noise transients, input signals identical in amplitude and phase are received by each of the channels. Channel 1 includes a high pass filter in the form of an R-C circuit comprising a capacitor 97 and a resistor 99, and Channel 2 has a corresponding R-C circuit comprising a capacitor 101 and a resistor 103. These filters serve to eliminate from further transmission, low frequency disturbances such as turntable rumble, and hum and thumps, which can occur in record playback, and are caused by record deformities such as warpage. These filters thereby protect the control unit from malfunction which could be caused by the disturbances if they were not filtered out.

Following each of the high pass filters are full wave rectifier circuits represented by diode 105 and resistor 107 in Channel 1 and diode 109 and resistor 111 in Channel 2, and a resistor 113 common to each full wave rectifier circuit. Resistors 107 and 111 are identical, but the polarities of rectifiers 105 and 109 are such that the full wave rectifier of line 93 produces a positive-going pulsating wave form at juncture 115 of resistor 113 and the line connecting lines 93 and 95, whereas the corresponding rectifier in line 95 produces a negative-going pulsating wave form at juncture 115.

The foregoing arrangement yields a voltage at juncture 115 which has a zero value when there are either equal or no noise components in Channels 1 and 2 and, in the event an imbalance exists in the voltages in the respective channels at any time and the voltage in or of the channels is greater in absolute value than the voltage in the other channel, a positive value when the noise level in Channel 1 exceeds that in Channel 2, or a negative value when the noise level in Channel 2 exceeds that in Channel 1. It will be recalled that the function of the switcher of which the control unit forms a part is to suppress noise transients, this being accomplished by only transmitting the signal in the channel having the lower noise level at any time. The polarity and magnitude of the voltage of juncture 115 at any time indicates the relative noise levels of the two channels.

The control unit of FIG. 3 further includes a differential amplifier 117 having a positive or non-inverting input terminal 119, and a negative or inverting input terminal 121 connected to a variable resistor or potentiometer 123 across a voltage source 125. Likewise, the control unit includes a second differential amplifier 127 having a negative or inverting input terminal 129, and a positive terminal 131 connected to a variable resistor or potentiometer 133 across a voltage source 135. The settings of variable resistors 123 and 133 can be synchronized so that the absolute magnitudes of the voltages at inlet terminals 121 and 131 are equal. When such synchronization is effected, the instantaneous voltage at juncture 115 must exceed a positive threshold to change the output state of amplifier 117 and must fall below an equal negative threshold to change the output state of amplifier 127. This serves as a sensitivity control for the control unit, to prevent it from generating signals in response to insignificant voltage differences between Channels 1 and 2.

Amplifiers 117 and 127 have output terminals 137 and 139, respectively, which are connected to a biastable multivibrator 141. Multivibrator 141 has a preset mode input terminal 143 connected to amplifier 117 and a clear mode input terminal 145 connected to amplifier 127. When a negative voltage condition exists at juncture 115 which is sufficient to overcome the positive voltage impressed on amplifier 117 by voltage source 125 and variable resistor 123, a switching command is instituted at the output of differential amplifier 117, which causes multivibrator 141 to be adjusted to its preset mode (or maintained there) to effect a positive voltage condition of outlet terminal 147. Similarly, when a positive voltage condition exists at juncture 115 and exceeds the negative voltage impressed across amplifier 127 battery 135 and variable resistor 133, a switching command is instituted at the output of differential amplifier 127, which causes multivibrator 141 to be adjusted to its clear mode (or maintained there), to effect a positive voltage condition at output terminal 149. Bistable multivibrator 141 must assume one of its two states at any time, so that only one of the two output terminals 147 and 149 will generate a signal at any time. Moreover, multivibrator 141 will remain in a given state until it is triggered into its other state by an appropriate input signal. A two-position switch 151 is connected to bistable multivibrator 141, for selectively connecting lines 153 or 155 (corresponding to terminals 83 and 85 in FIG. 2) to the multivibrator. Accordingly, when the high frequency component of the signals transmitted over one of lines 93, 95 exceeds the high frequency component of the simultaneous signal in the other of lines 93, 95, either a net positive or negative going voltage exists at juncture 115. In response to such a net voltage, and if such voltage exceeds the threshold established by the setting of the appropriate variable resistor 123 or 125 (depending on the polarity of the voltage at juncture 115), a signal is transmitted to one or the other of input terminals 143 and 145 of bistable multivibrator 141, and switch 151 is set to energize one or the other of lines 153 and 155 to close the switch connected thereto.

In some situations, even where it is not necessary or desired to suppress "ticks" or other transient noise components, there may exist dropouts, fading or other sudden drops in the level of the carrier signal which should be alleviated. The latter object can be achieved with the circuit in FIG. 3 by reversing the operation of switch 151, to reverse the connection of terminals 147, 149 to switches 79, 81 or 27, 29. In other words, switch 151, which normally functions as a cut switch to disable from transmission the channel having the higher amplitude (due to the presence of noise transients), is reversed in function to become an enhance switch to disable from transmission the channel having the lower amplitude (due to the presence of dropout or the like). Switch 151 can also be similarly employed to enhance the reproduction of noise transients for such purposes as demonstrating the effectiveness of the switcher.

Normally, in the reproduction with stereophonic playback equipment of a lateral-cut monophonic phonograph recording, the two channels of reproduction are equally mixed, and this has the desirable result that effects caused by the vertical component of the stylus motion, such as surface noise, turntable rumble, and vertical components caused by pinch effect, tracing error and record wear are cancelled out. In light of this cancellation of purely vertical transient noise, there may be occasions when the combined or summed signal of the two channels has a lower net noise transient level than either of the component signals in Channels 1 and 2. Therefore, as a further refinement to the system illustrated in FIG. 2, the system shown in FIGS. 1 and 4 includes a summer whose output can be compared with that of Channels 1 and 2 to select the quietest signal for transmission and reproduction at any time. Referring specifically to FIG. 4, the system depicted therein includes amplifiers 161 and 163 similar to amplifiers 9 and 11 in FIG. 1, and a switcher 165 similar to switcher 17. Switcher 165 compares the signals from Channels 1 and 2 and transmitted through amplifiers 161 and 163, and in turn transmits the quieter signal to an amplifier 167. A summer 169 combines the instantaneous signals from the two channels and transmits the summed signal to an amplifier 171. Amplifiers 167 and 171 direct their respective signals to second comparing means in the form of a second switcher 173, which makes a comparison therebetween and transmits the quieter of the two signals as its output.

Figure 5:
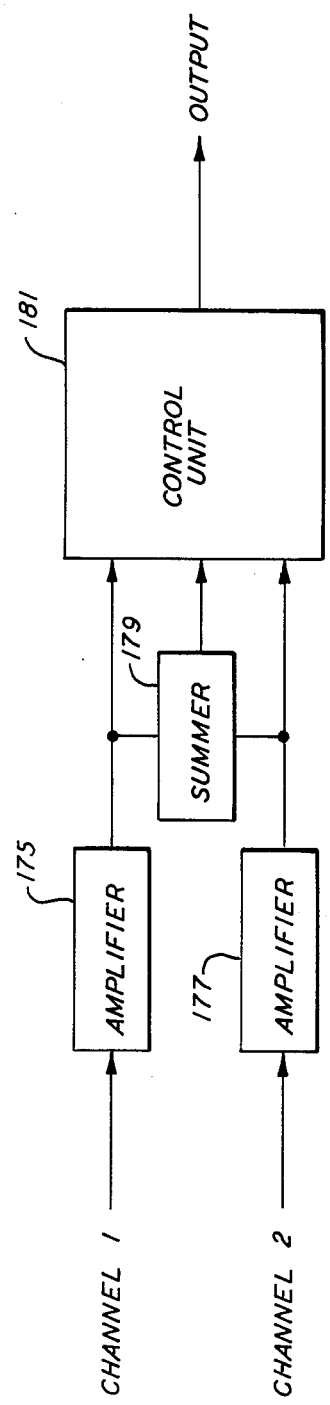
FIG. 5 is a schematic illustration of a variation of a portion of the circuitry shown in each of FIGS. 1 and 4.

The method used by the apparatus of FIG. 4 is sequential in nature in that first channels 1 and 2 are compared, and thereafter the summed signals therefrom are compared with the quieter of the two channels. An alternative to the embodiment illustrated in FIG. 4 is shown in FIG. 5, wherein signals on channels 1 and 2 are fed to amplifiers 175 and 177, and the respective amplified signals are then transmitted both to a summer 179, and to a control unit 181 along with the amplified summed signals from summer 179. This arrangement makes unnecessary a separate amplifier for the output of the summer and makes a second switcher also unnecessary. The system of FIG. 5 is simultaneous in nature rather than sequential, since the comparisons are made at one time.

Figure 6:
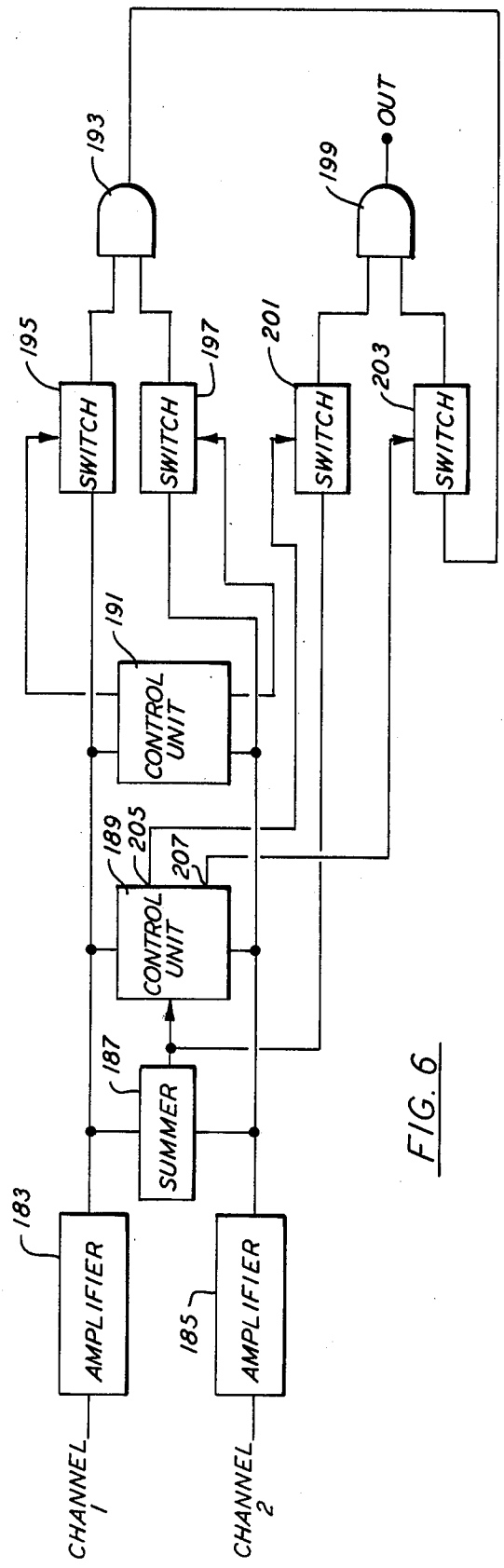
FIG. 6 is a schematic representation of another variation of part of the system of FIG. 4.

A simultaneous switching system is shown in more detail in FIG. 6. This system includes an amplifier 183 in Channel 1 and an amplifier 185 in Channel 2. Between the two channels are connected a summer 187, a first control unit 189 (to which the output of summer 187 is also fed), and a second control unit 191. Channels 1 and 2 terminate in a summer 193, and switches 195 and 197 under the control unit 191 are disposed in the two channels. A line from the output terminal of summer 187, and an output line from summer 193, lead to a summer 199, and a pair of switches 201 and 203 are disposed on the two lines. The latter switches are controlled by control unit 189 through electrical lines running from the outlet terminals 205 and 207 of control unit 189.

The simultaneous and corresponding signals on Channels 1 and 2 are amplified by amplifiers 183 and 185, and transmitted to summer 187 and each of control units 189 and 191. Control unit 189 compares the summed signal of Channels 1 and 2 with the latter signals individually, and transmits an appropriate signal to close switch 201 if the summed signal is quieter, or to close switch 203 if either signal in the individual channels is quieter at any time. Control unit 191 operates in the manner of control unit 19 (FIG. 1) to operate switches 195 and 197 to effect the transmission of the quieter of the signals on the two channels to switch 203, for possible transmission as the output signal of the system.

Figure 7:
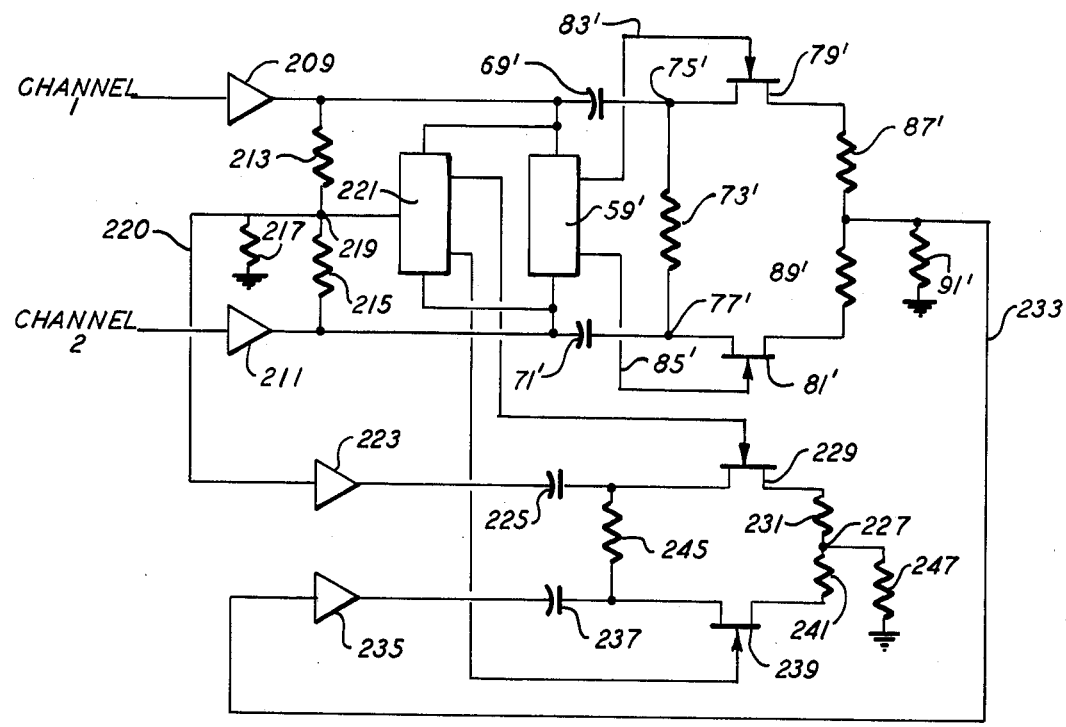
FIG. 7 shows an electrical circuit with componenets which can be used to form the system of FIG. 6.

A more specific circuit according to system of FIG. 6 is depicted in FIG. 7. An amplifier 209 is included in Channel 1 and a like amplifier 211 is in Channel 2. The summer comprises equal resistors 213 and 215 connected to the respective channels, and a grounded resistor 217 connected to a line leading from the juncture 219 of resistors 213 and 215. The voltage at juncture 219 is the summation of the voltage of the two channels at any time. A control unit 221 corresponding to control unit 189 is electrically connected to juncture 219, and to Channels 1 and 2. The second control unit and its associated components are similar in function to corresponding parts of the switcher in FIG. 2, and these parts have been ascribed like numerical designations with a prime suffix, reference being made to the foregoing embodiment for a description of this aspect of the apparatus of FIG. 7.

A signal conducting line 220 leads from control unit 221 and juncture 219 (i.e. the summer) to an amplifier 223, a capacitor 225, and terminates at a juncture 227. A switch 229 under the control of unit 221, and a resistors 231 are further included in the line from juncture 219. Line 220 carries a signal equal to the sum of the signals on Channels 1 and 2, and a second line 233 carries the quieter of the signals of the two channels from the juncture of resistors 87', 89', and 91' to an amplifier 235, thence to a capacitor 237, to juncture 227. A switch 239, also controlled by unit 221, is in line 233, and a resistor 241 is disposed between switch 239 and resistor 247. A resistor 245 is connected between lines 220 and 233. A resistor 247, together with resistors 231 and 241, form a summer whose output is at juncture 227. This summer corresponds to summer 199 (FIG. 6).

Line 220 carries the sum of the signals in the two channels to juncture 227 when switch 229 is closed. Line 233 carries the signal from the quieter of Channels 1 and 2 (selected as discussed with regard to FIG. 2) to juncture 227 when switch 239 is closed. Capacitors 225 and 237 in conjunction with resistor 245, serve a low frequency mixing function, similar to previously described capacitors 69 and 71, and resistor 73, in FIG. 2.

Control unit 221 compares the summed signal of Channels 1 and 2 with the signals of the two channels to selectively close one of switches 229 and 239, to transmit the signal with the lowest transient noise level through outlet resistor 247.

Figure 8:
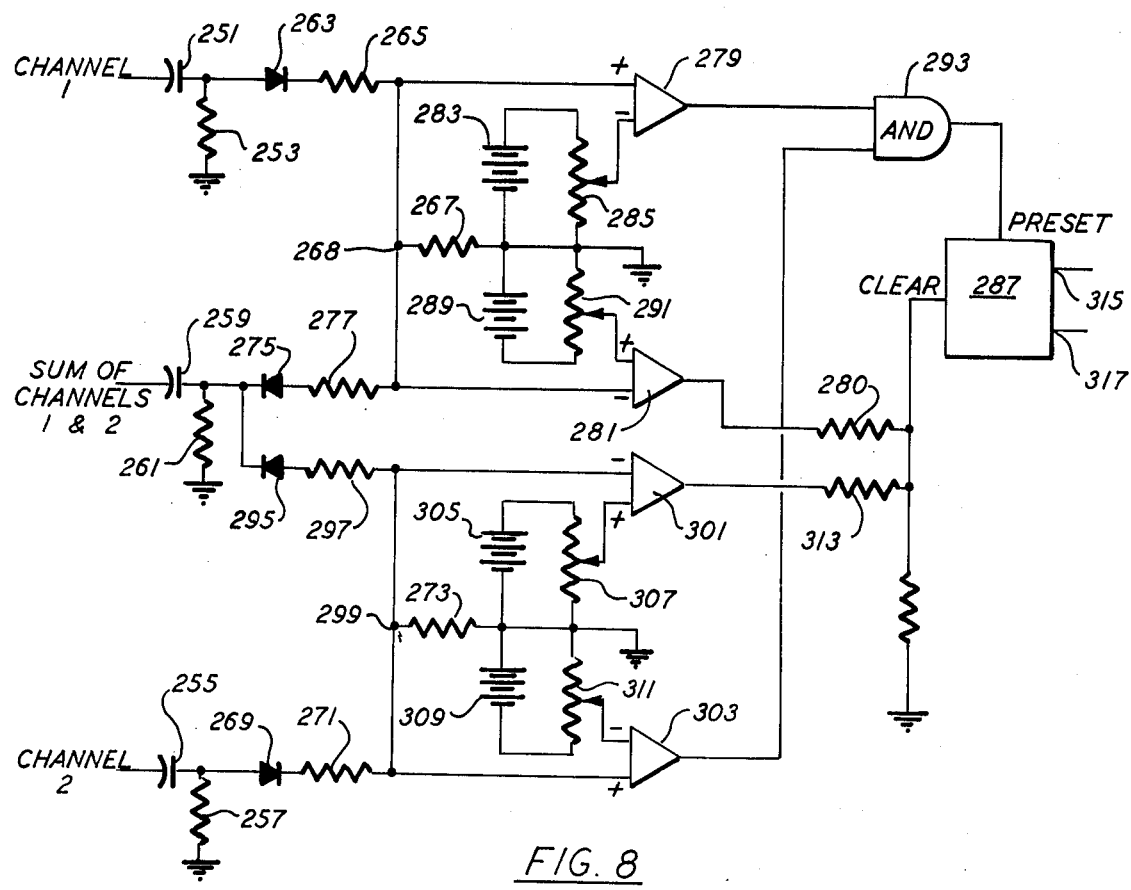
FIG. 8 illustrates an embodiment of a control unit which can be used in the circuit of FIG. 7.

The details of a control unit for use as control unit 221 are the subject of FIG. 8. The unit in FIG. 8 is quite like that in FIG. 3, to which reference is made, although it compares a summed signal with each channel signal, rather than comparing two channel signals.

The inputs to the control unit in FIG. 8 are from Channel 1 (from amplifier 209), from Channel 2 (from amplifier 211), and from the summer (from juncture 219). The inlet line from Channel 1 includes a high pass filter comprising capacitor 251 and resistor 253, to filter out low frequency components from the line; likewise, a high pass filter comprising a capacitor 255 and a resistor 257 is in the inlet line of Channel 2; and another such filter having a capacitor 259 and a resistor 261 is in the inlet line from the summer. As previously described, these filters protect the control unit from malfunction which could be caused by low frequency disturbances. Channels 1 and 2 include full wave rectifier circuits comprising, in Channel 1, a rectifier represented by diode 263 connected in series with a resistor 265, and a resistor 267 (connected in a line leading from a connecting line between Channel 1 and the line from the summer); and in Channel 2, a full wave rectifier represented by diode 269 in series with a resistor 271 and a resistor 273 (connected in a manner corresponding to resistor 267). The direction of conductivity of the rectifier in Channel 1 is such as to produce a positive-going pulsating wave form at the juncture of resistors 265 and 267. Similarly, the direction of conductivity of the rectifier in Channel 2 is such as to yield a positive-going pulsating wave form at the juncture of resistors 271 and 273.

Referring to the mixed input channel from the summer, a full wave rectifier is also incorporated in this channel, and includes a full wave rectifier 275, a resistor 277 and previously mentioned resistor 267. The polarity of the full wave rectifier of the mixed input channel is such as to produce a negative-going pulsating wave form at the juncture of 268 of resistor 277 and resistor 267. Thus, there exists at juncture 268 a voltage equal to the instantaneous sum of the rectified voltages of Channel 1 and the sum of Channels 1 and 2.

The voltage at juncture 268 is applied to the inputs of a pair of differential amplifiers 279 and 281, in much the same manner as the voltage at juncture 115 in FIG. 3 was applied to amplifiers 117 and 127. Accordingly, when the voltage at juncture 268 is positive and of sufficient amplitude to overcome the voltage established by voltage source 283 and variable resistor 285, amplifier 279 will be triggered to deliver a switching command to AND gate 293. On the other hand, when the voltage at juncture 268 is of sufficient negative amplitude to overcome the positive voltage impressed across amplifier 281 by voltage source 289 and variable resistor 291 (resistors 285 and 291 being coaxially mounted potentiometers), amplifier 281 is triggered to give a switching command through resistor 280 to switch or maintain bistable multivibrator 287 to its "clear mode".

Channel 2 functions in conjunction with the mixed input channel in a similar manner. The mixed input channel includes a second full wave rectifier including a full wave rectifier 295, a resistor 297, and the resistor 273 which joins the latter resistor at a juncture 299. The polarity of the rectifier in Channel 2 is such as to yield a positive going wave form at juncture 299, whereas the rectifier in the mixed input channel yields a negative going pulsating wave form at that juncture. A pair of differential amplifiers 301 and 303, corresponding to amplifiers 281 and 279, a voltage source 305 and a variable resistor 307 corresponding to elements 289 and 291, and a voltage source 309 and a resistor 311 corresponding to source 283 and resistor 285, are further provided between the mixed input channel and Channel 2.

When the transient noise in Channel 2 exceeds that in the mixed channel, the voltage at juncture 299 will be positive. When this positive voltage exceeds the opposing voltage established by source 309 and variable resistor 311, amplifier 303 gives a switching command to AND gate 293. Likewise, when the voltage at juncture 299 is sufficiently negative to exceed the positive voltage established by source 305 and variable resistor 307, amplifier 301 gives a switching command through resistor 313 to the "clear" terminal of bistable multivibrator 287.

Thus, the individual signals in each of Channels 1 and 2 are compared with the sum of voltages in the channels. In the event that the sum voltage is quieter than both of the component voltages from the two channels, and provided it exceeds the adjusted threshold voltages established by the appropriate potentiometers, amplifiers 279 and 303 generate both switching commands to AND gate 293. Such simultaneous occurrence effects the generation of an output signal which is transmitted to the "pre-set" input terminal of bistable multivibrator 287. In response to the signal at its preset input, multivibrator 287 generates a signal through its output terminal 315 to close switch 229 in FIG. 7. The closing of switch 229 thus effects the selection of the summed or mixed signal to be applied to the output of the switcher.

Whenever the signal of the mixed channel has a higher noise level than that of either of Channel 1 or Channel 2 a voltage signal is applied to the clear input terminal of multivibrator 287. Thus, when the transient noise level in Channel 1 is less than that in the mixed input channel, so that a net negative voltage exists at juncture 268, and the preceding voltage exceeds the previously discussed threshold value, amplifier 281 generates a voltage signal which is transmitted across resistor 280 to the "clear" input terminal of bistable multivibrator 287. At the same time, differential amplifier 279 will not be delivering a blanking command to AND gate 293. Therefore, even though differential amplifier 303 may be delivering a signal to the input of the AND gate, the AND gate will not deliver a signal to the "preset" terminal of device 287. When a similar voltage exists at juncture 299, amplifier 301 puts out a signal through resistor 313 to the "clear" input terminal of bistable multivibrator 287. The outputs of amplifiers 281 and 301 are added across resistor 314 and applied to the "clear" terminal of bistable multivibrator 287. Under this condition, differential amplifier 303 will not be delivering a switching command to gate 293. It can be seen that whenever the noise level in the mixed input channel exceeds the noise level in either Channel 1 or Channel 2, bistable multivibrator 287 will generate a signal through its output terminal 317 which is connected to switch 239 (FIG. 7), to close the latter switch. This action causes control unit 221 (FIG. 7) to deliver from its output the quieter signal of Channels 1 or Channel 2 depending on which of switches 79' and 81' is closed. Since device 287 is a bistable multivibrator, it will generate signal through only one output terminal at a time. One of switches 229 and 239 will always be closed and the other will always be open.

THE AUTOMTIC BALANCE CONTROL

For optimum operation of the switcher, the voltage levels at junctures 21 and 23 in FIG. 1, and at corresponding junctures in the various circuits described herein should be approximately equal. One way of accomplishing this criterion is by metering the signals at these junctures and manually adjusting the gain of amplifier 9 or 11 and the corresponding amplifiers in the other circuits. However, a more convenient and accurate means for obtaining the desired balance is through an automatic balance control system such as the following. FIG. 9 shows an automatic balance control system for balancing the voltage signals in the two channels as described above. The system comprises input Channels 1 and 2 which lead to a switcher 321. An amplifier 323 is disposed in Channel 1 and a similar amplifier 325 is located in Channel 2. A control unit 327 performs the channel selection function as described previously. Control unit 327 includes the basic switcher control unit 329 which corresponds to the previously described control units, and an imbalance sensor 331 for effecting the automatic balance control function. Through a line 333 connecting the output terminal of imbalance sensor 331 and amplifier 323, the sensor adjusts the gain of amplifier 323 so that its carrier signal output level closely equals the carrier signal output level of amplifier 325.

An automatic balance control circuit of the type described above is shown in FIG. 10. This balance control circuit monitors the voltage in a switcher control unit having a rectifier and summer circuit as described previously, such as at juncture 115 in the apparatus of FIG. 3, and effects the gain control of one of the amplifiers accordingly. The circuit shown in FIG. 10 incorporates a portion of the circuitry of FIG. 3, and elements corresponding to those of the previous figure have been ascribed like numerals with a prime superscript. It will be recalled that the voltage at juncture 115' will have either a net positive voltage or a net negative voltage if the channels are out of balance (or in other words, if an imbalance exists between the voltages of the signals in the respective channels at any time), and will have no net voltage if the channels are in balance. In order to eliminate the effect of noise transients in the measurement of the signal balance between the channels, the voltage at juncture 115' is applied to a low pass filter which comprises resistors 335 and 337 and capacitors 339 and 341. For anticipated applications of the system, this RC filter would normally have a cutoff frequency in the order of 2500 Hz, and a slope of 12 decibels per octave. Such characteristics will enable the low pass filter to pass the significant energy area of music or speech while effectively eliminating the noise transients.

The output of the preceding low pass filter will have a positive-going or a negative-going wave form according to the wave form at juncture 115', from which the higher frequencies have been removed. The output of the filter is connected to the input terminal 343 of a comparator 345. Comparator 345 is provided with a second input terminal 347 which is connected to ground. The output of comparator 345 will always be in either a negative or positive state depending on which of Channels 1 and 2 is stronger so as to cause the voltage at juncture 115' to be either positive or negative. The output of comparator 345 will stay in a state of either a positive or negative polarity until the voltage at juncture 115' changes.

The output terminal 349 of comparator 345 is connected to an R-C filter comprising a resistor 351 and a grounded capacitor 353. The characteristics of the latter two components are, for most of the anticipated applications of the circuit, selected so that its time constant will be on the order of one second. The output of the foregoing R-C filter is applied to an inverting input terminal 355 of a differential amplifier 357. Amplifier 357 has a second input terminal 359 to which is applied a variable input voltage according to the setting of a variable resistor 361 across which is impressed a voltage from a voltage source 363. The output of amplifier 357 is proportionate to the difference between the input voltage at terminal 355 and the adjusted input voltage at terminal 359, as determined by the setting of variable resistor 361.

The circuit in FIG. 10 further includes a lamp 365 which is connected at one terminal to a voltage source 367, and as its other terminal to the output terminal of amplifier 357. The output voltage of amplifier 357 may be of either polarity, and the magnitude of the voltage source 367 is such that the difference between the voltage generated by the voltage source 367 and amplifier 357 is always of the same polarity. Therefore, the voltage applied across lamp 365 follows a continuously increasing curve (plotting voltage against time) as the circuit imbalance changes from a greater voltage in Channel 1 to a greater voltage in Channel 2.

Variations in the voltage difference between the two channels is reflected by the corresponding variations in the intensity of lamp 365. It is upon the detection of such variations that the automatic balance control is accomplished in the circuit of FIG. 10. A photo-sensitive resistor 369 is located in the path of illumination of lamp 365. The resistance of element 369 is inversely related to the intensity of the illumination of lamp 365, so that as the intensity of the lamp increases, the resistance of element 369 decreases. Amplifier 9', across which is connected feedback resistor 371, is connected in series with photo-sensitive resistor 369. The other terminal of device 369 is connected to the Channel 1 input, which is assumed to be connected to a device that has an output impedance that is low relative to the lowest value assumed by resistor 369. It can be seen that by virtue of the foregoing arrangement, the gain of amplifier 9' is automatically adjusted according to variation in the illumination of lamp 365, which in turn varies with variation in the voltage difference between Channels 1 and 2. It is the setting of variable resistor 361 which establishes the operating point of the system such that amplifiers 9' and 11' will have the same gain when equal signals are applied to Channels 1 and 2.

The operation of the automatic balance control circuit of FIG. 10 is as follows. When the voltage in Channel 1 exceeds that in Channel 2, a positive voltage appears at juncture 115'. Upon such occurrence, amplifier 345 assumes its positive state and the voltage across capacitor 353 begins to increase slowly. As the voltage across capacitor 353 increases, the output signal of amplifier 357 becomes more negative because capacitor 353 is connected to the negative, or inverting, input terminal of amplifier 357. This change in the output signal of amplifier 357 causes the current through lamp 365 to decrease, and the illumination of the lamp falls. In response to this change in illumination, the resistance of photo-sensitive resistor 369 increases, to in turn reduce the gain of amplifier 9'. This change in the gain of amplifier 9' will continue until a negative voltage appears at juncture 115', and in response comparator 345 assumes a negative state. Capacitor 353 then slowly discharges through resistor 351, causing the output of amplifier 357 to become more positive to increase the lamp's illumination and the drop in the resistance of photo resistor 369. This occurrence causes the gain of amplifier 9' to increase until the polariity at juncture 115' changes once again.

Thus, the balance control circuit of FIG. 10 is in a constant state of oscillation, primarily because comparator 345 has no neutral state, but must have either a positive or a negative output. The amplitude and period of oscillation of the circuit are governed by the integrating time constant as established by the resistance of resistor 351, the capacitance of capacitor 353, and the thermal inertia of lamp 365. Component value optimization restricts the oscillative gain of amplifier 9' to a balance condition of about plus or minus 0.1 decibel, an amount too slight to be audible.

THE NOISE TRANSIENT BLANKING DEVICE

Another aspect of the present invention relates to the removal of certain noise transients by blanking at least a portion of an output signal when the switching operation does not adequately remove undesirable noise transients, or in some instances when there is no switching operation. Rather than completely cancelling the output signal at any time, it has been found advantageous to only blank out that range of frequencies which make a major contribution to the audible noise transient. For example, in most anticipated applications of the invention, it has been found that there is generally no need to blank frequencies in excess of about 5000 Hz when the blanking device is used in conjunction with the switching device, since the latter very effectively eliminates noise components above 5 KHz. The transient noise content below 500 Hz is normally not significant, and these frequencies need not be blanked either. By excluding these two extremes of the audio frequency range from the blanking operation, it has been found that a significant improvement in the sense of continuity of the signal to the ear of the listener is achieved during the blanking operation, in comparison to what would be achieved by blanking a wider range of frequencies. Thus, for most intended applications, a frequency band of from 500 Hz to 5000 Hz is blanked. This range is subject to adjustment to suit the nature of the particular noise transients which exist in a given recording by the alteration of the time constants of the band elimination filter circuit. Of course, the shorter the blanking time, the less audible and discernible a blank is likely to be, provided that the duration of the blank is at least equal to the duration of the transient noise.

Another criterion for the blanking of noise transients is that the switching operation for establishing and terminating a blank should be as subtle and unnoticeable as possible, and should not introduce audible switching transients. Since it is generally desirable to commence a blank nearly instantaneously, the gradual institution of a blank is impracticable. On the other hand, blanking can be switched off or terminated more gradually as explained hereinafter.

In addition to the foregoing criteria for the blanking operation and apparatus, the system should be able to distinguish noise transients from the normal transients of the reproduced signal. The embodiments of the invention described below make use of the fact that in general noise transients are of a significantly shorter duration than normal signal transients. Furthermore, the embodiments described below make use of the signal characteristics that the products of amplitude and rise time, and of amplitude and fall time, for noise transients are generally greater than those for signal transients. Since it is generally not practicable for blanking circuits to distinguish infallibly between the onset of a noise transient and the onset of a signal transient in every case, the blankers described below have been devised so that the blanking of an occasional normal signal transient will not be noticeable.

Figure 11:
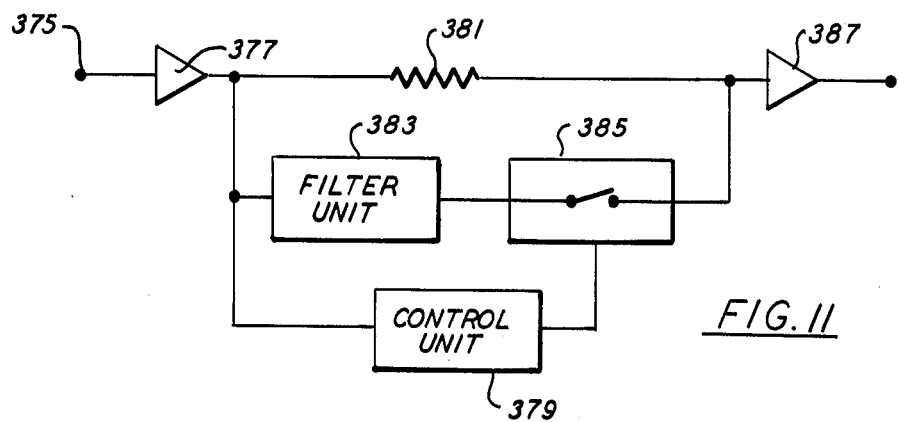
FIG. 11 illustrates a system for effecting the blanking function according to the invention.

Referring now to the FIG. 11, a blanking system is shown which comprises an input terminal 375 of a low output impedance amplifier 377. The output of amplifier 377 is connected to a circuit comprising two parallel conducting paths and to the input of a control unit 379. The first of the foregoing paths includes a resistor 381, and second path includes blanking means in the form of a filter unit 383 followed by enabling means in the form of a switch 385. A second amplifier 387 is located at the output juncture of the two parallel conducting paths. The input impedance of amplifier 387 is high relative to the resistance of resistor 381. When switch 385 is open, the signal generated by amplifier 377 is impressed across resistor 381 and applied to the input terminal of amplifier 387.

The actual blanking operation is performed by the branch line including the filter unit 383 and switch 385. Switch 385 is under the control of control unit 379. Unit 379 effects the closing of switch 385 when noise transients to be blanked are detected. The function of filter 383 is to act cooperatively with resistor 381 to attenuate the most audible frequency components of a noise transient when switch 385 is closed.

Figure 12:
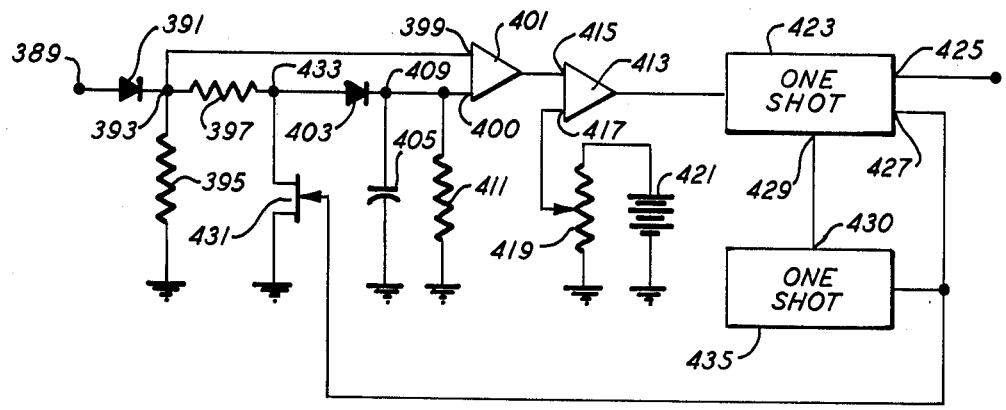
FIG. 12 shows a circuit of a control unit for use in the system of FIG. 11.

A control unit for use in the system in FIG. 11 is illustrated in FIG. 12. The input terminal 389 of the control unit corresponds to the output terminal of amplifier 377 in FIG. 11. This input signal is rectified by a full-wave rectifier symbolized by diode 391. The rectified signal, which is in the form of a fluctuating, positively-polarized voltage which follows the instantaneous value of the input signal at terminal 389, is applied to the juncture 393 of grounded resistor 395 and resistor 397. The voltage at juncture 393 is also applied to one input terminal 399 of a differential amplifier 401. Resistor 397 couples the output of rectifier 391 to a peak detector circuit comprising diode 403, capacitor 405, and resistor 411, which components join at a juncture 409. Capacitor 405 tends to charge to the peak value of the rectified signal, which in turn represents the absolute peak value of the input signal at input terminal 389. Capacitor 405 discharges through resistor 411 for most intended applications of the system, capacitor 405 and resistor 411 being selected so that the time constant represented by the product of the resistance of resistor 411 and the capacitance of capacitor 405, is of the order of 100 milliseconds. The charging time of capacitor 405, which is determined by the product of the capacitance of capacitor 405 and the resistance of resistor 397 and diode 403, produces a time delay between the peak voltage appearing at juncture 393 and that developed at juncture 409. Hence, there is normally a voltage differential between juncture 393 and juncture 409 under conditions of changing signal input amplitude, since the voltage at juncture 393 is proportionate to the instantaneous absolute value of the signal voltage, whereas the capacitance of capacitor 405, with some time delay, tends to charge to the peak value of the signal. Since the voltage at juncture 393 is applied to one input terminal 399 of amplifier 401 and the voltage at juncture 409 is applied to the other input terminal 400 of amplifier 401, amplifier 401 amplifies the amount by which the voltage at juncture 393 exceeds that at juncture 409. In other words, amplifier 401 amplifies the difference between the instantaneous absolute value of the signal input and the rectified peak value of the signal averaged over a predetermined period such as 100 milliseconds. Any noise transient that is to be suppressed will have an amplitude considerably in excess of the average peak value of the signal in most instances. Thus, when a noise transient occurs, the voltage at juncture 393 rises abruptly prior to a corresponding increase in the voltage at juncture 409. Differential amplifier 401, in response to this sudden large voltage difference, will deliver an output signal reflective thereof.

A comparator 413 has one input terminal 415 connected to the output terminal of amplifier 401, and another input terminal 147 connected to a variable resistor or potentiometer 419 which is connected in a circuit including a voltage source 421. Potentiometer 419 serves as a sensitivity adjustment for the triggering of comparator 413. When the input signal at terminal 415 exceeds the voltage applied to input terminal 417 of comparator 413 as established by the setting of potentiometer 419, comparator 413 generates a blanking voltage signal to a blanking signal control means in the form of a monostable multivibrator 423 connected to the output terminal of comparator 413. Multivibrator 423 is of the type which, once triggered, generates an output voltage signal for a predetermined period of time. This multivibrator is selected so that this predetermined period of time is the desired blanking time. Once this time period has expired, the multivibrator returns to its original state.

Monostable multivibrator 423 has three output terminals designated by the numerals 425, 427, and 429 respectively. Terminal 425 is connected to switching device 385 shown in FIG. 11. Terminal 427 is connected to a disabling means in the form of a switch 431 which can be a field effect transistor. Switch 431 is provided to prevent signals from being applied to the peak detector circuit comprising diode 403, capacitor 405 and resistor 411 during the blanking period, to prevent the peak detector from charging towards the amplitude of the noise transient being suppressed. Switch 431 accomplishes this object by functioning to short circuit juncture 433 between resistor 397 and diode 403 to ground. Resistor 397 serves to prevent the operation of switch 431 from having any appreciable effect on the voltage appearing at juncture 393.

Another monostable multivibrator 435 is connected to output terminal 427 of multivibrator 423. Multivibrator 435 is a second disabling means and generates an output signal of a predetermined period of time which, for the anticipated application of the system, would normally be about 5 milliseconds. The output terminal 430 of multivibrator 435 is connected to terminal 429 of multivibrator 423 so that the latter cannot retrigger until the output signal of unit 435 has terminated.

Figure 13:
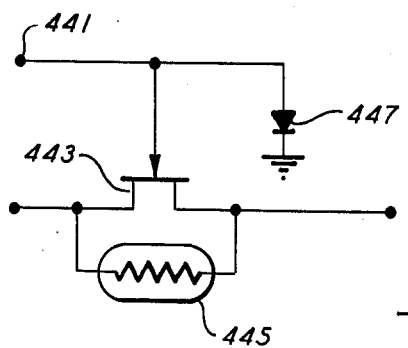
FIG. 13 illustrates a switch of the type incorporated in the circuit of FIG. 11.

FIG. 13 illustrates a switch which can be incorporated as switch 385 shown schematically in FIG. 11. This switch has an input terminal 441 which is connected to the output terminal 425 of monostable multivibrator 423 in FIG. 12. The switch includes a fast acting switch 443 which can be a field effect transistor, and further includes a delay means in the form of a variable resistor 445 which responds to signals generated by monostable multivibrator 423 by assuming a low resistance value through a resistance control means incorporated therein, and then returning to a very high resistance as the signal from the multivibrator terminates. This gradual change of resistance provides the desired gradual switching off of the blanker. Resistor 445 can be a photo-sensitive resistor which is preferably encapsulated in a package with a light emitting diode 447. Diode 447 is energized in response to the generation of a signal by monostable multivibrator 423, and when energized emits light which falls on the photo-sensitive resistor to cause the reduction in resistance referred to above. When the signal from the multivibrator terminates, diode 447 is deenergized so that its illumination ceases gradually; hence, the resistance of variable resistor 445 increases correspondingly.

An alternative blanking system to that shown in FIG. 11 is depicted in FIG. 14. Those components which are common to the two embodiments are ascribed the same numerical designation with a prime (') designation. A comparison of the two embodiments shows that switch 385 in FIG. 11 has been replaced by several components in FIG. 14. Specifically, a switch 451 is connected to the output terminal of filter 383'. Also, another parallel branch line to that connecting amplifiers 377' and 387' is included in the circuit, the latter line containing a differential amplifier 453, a switch 455, and a sample and hold device 457. Differential amplifier 453 has two input terminals - 459 and 461. Terminal 459 is connected to the output of filter 383' and terminal 461 is connected to the input terminal of filter 383'; the output of differential amplifier 453 thus equals to the instantaneous voltage difference across filter 383' (if the gain of unit 453 is unity).

As described previously, when control circuit 379' detects a noise transient which is to be blanked, it generates a command signal. In the embodiment of FIG. 14, such signal is applied to switches 451 and 455 to close those switches. The closing of switch 451 effects the initiation of the blanking function. The closing of switch 455 connects sample and hold device 457 to differential amplifier 453, and the sample and hold device charges to the value of the output voltage of the differential amplifier 453. When the blanking period terminates, switches 451 and 455 open, and amplifier 387' is switched from the output of filter 383' to the signal applied across resistor 381'. Since the voltage stored by sample and hold device 457 is equal to the difference between the instantaneous voltage impressed across filter 383' and the input voltage to the filter, the effect which occurs when switches 451 and 455 are opened is that the charge stored by device 457 is superimposed upon the signal appearing at the input of amplifier 387'. Therefore, the instantaneous value of the voltage at the input of amplifier 387' is unchanged when the two switches are opened to conclude the blanking operation. Therefore, no noise transient due to a step function change in the instantaneous signal level occurs at the conclusion of the blanking process. The discharge of sample and hold device 457 occurs gradually, so that the signal at the input to amplifier 387' changes in a like manner.

A circuit according to the system shown in FIG. 14 is illustrated in FIG. 15. Those components common to FIGS. 14 and 15 have been ascribed their same numerical designations in FIG. 15. The switch corresponding to switch 451 comprises a field effect transistor 463, and a field effect transistor 465 is used as switch 455. Provision for sample and hold device 457 is accomplished by means of a grounded capacitor 467, and a grounded resistor 469 connected in parallel therewith. It may be seen that, as described above, when switches 463 and 465 close, capacitor 467 charges rapidly to the output voltage of differential amplifier 453, which is equal to the instantaneous difference in voltage between the input and output voltages of filter unit 383'. At the conclusion of the blanking period, both switches open, and capacitor 467 discharges through resistors 468 and 469. Also, as explained earlier, since the charge on capacitor 467 corresponds to the difference in instantaneous voltage across filter unit 383', and since this voltage is applied to amplifier 387' upon the opening of switches 463 and 465, the charge on capacitor 467 is superimposed upon the signal at the input of amplifier 387'. The foregoing occurrence has the effect of leaving the instantaneous voltage at amplifier 387' unchanged when switches 463 and 465 open at the conclusion of the blanking operation, and the discharge of capacitor 467 through resistors 468 and 469 causes the voltage from the capacitor to decay exponentially, and the signal at the input of amplifier 387' gradually and inaudibly loses the biasing of its point of symmetry.

Figure 16:
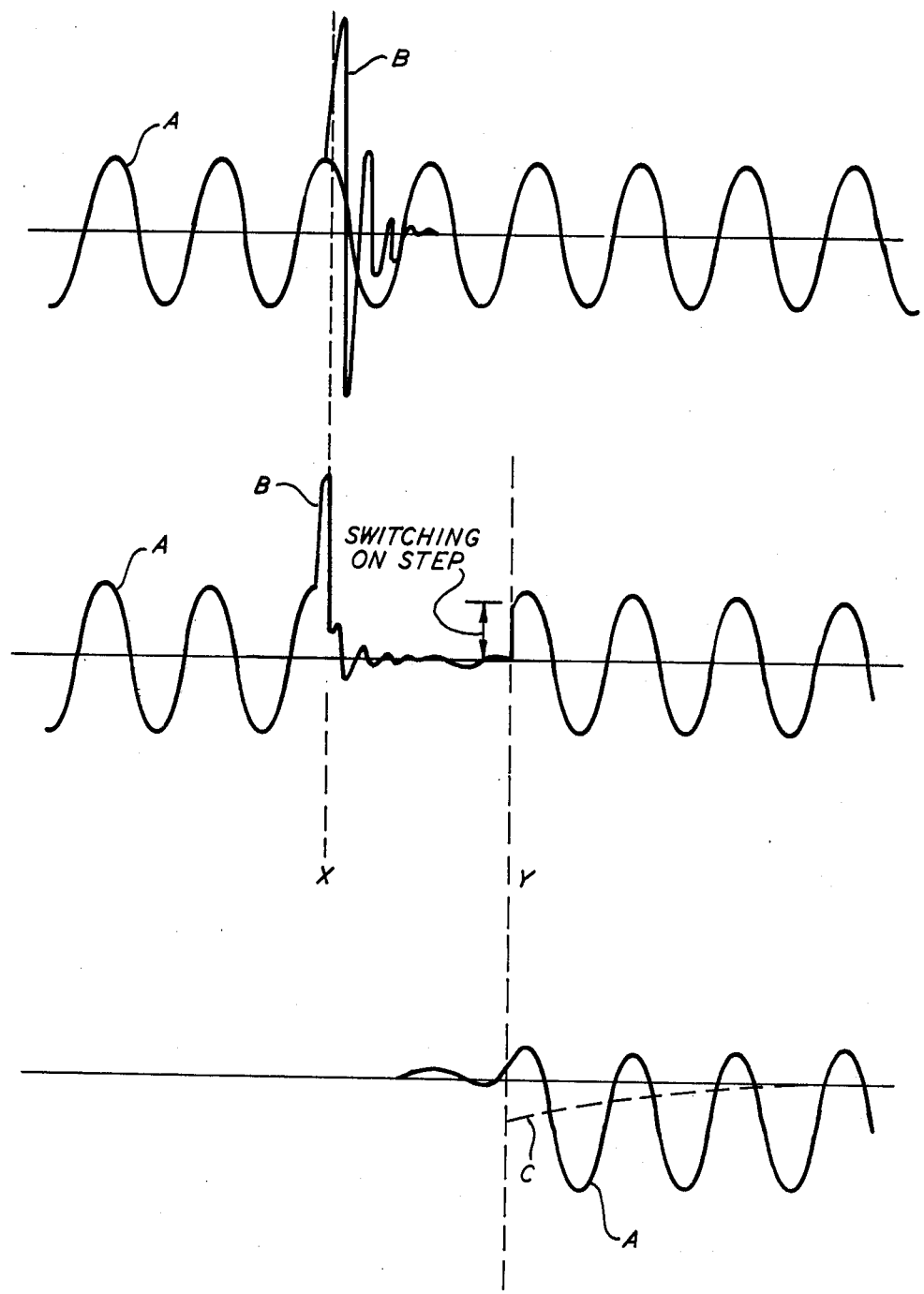
FIG. 16 is a graphical illustration of the operation of the circuit shown in FIG. 15.

The operation of the circuit of FIG. 15 is illustrated graphically in FIG. 16. The uppermost graph in FIG. 16 represents a normal input signal A whose frequency is within the attenuation band of the blanking circuit. A noise transient B is shown superimposed on signal A. The middle graph of FIG. 16 represents the action of the blanker. Point X indicates the time at which the operation of the blanker commences. It may be seen that immediately upon commencement of the blanking operation, there is a large reduction in the amplitude of signal A. Point Y indicates abrupt switching off of the blanker. An examination of signal A at point Y indicates an abrupt step in signal A, this step normally being audible, and hence undesirable.

The lowermost graph in FIG. 16 indicates the effect of eliminating the abrupt step at the termination of the blanking operation. The graph shows the effect of the discharge of sample and hold device 457, which in FIG. 15 comprises capacitor 467 and resistors 468 and 469, upon the termination of the blanking operation. The effect shown in this graph of FIG. 16 is the superimposition of a direct current bias on the fluctuating wave form, the bias being equal in magnitude to the step illustrated in the middle graph of FIG. 16. The dotted line C represents the exponential decay of the direct current bias, and the gradual and inaudible return of the point of symmetry of signal A to its normal zero potential.

Figure 19:
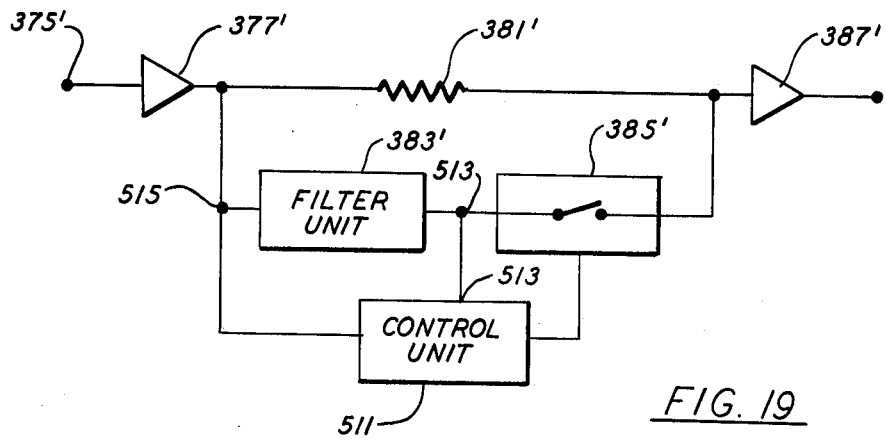
FIG. 19 is a schematic representation of an alternate blanking system to that of FIG. 11.

An alternative blanking system to those shown in FIG. 11 and FIG. 14 is depicted in FIG. 19. Those components that are common to FIG. 11 and FIG. 19 are ascribed the same numerical designation with a prime (') designation. A comparison of the embodiments of FIG. 11 and FIG. 19 shows that, in FIG. 19, the control unit accepts a signal from the output of the filter unit.

This alternative blanking system provides a third means of terminating the blank in a relatively noise-free manner. This is done by virtue of extending the duration of the blank beyond the fixed blanking period, until such time as the momentary signal level at the input to the filter is the same as the momentary signal level at its output.

Figure 20:
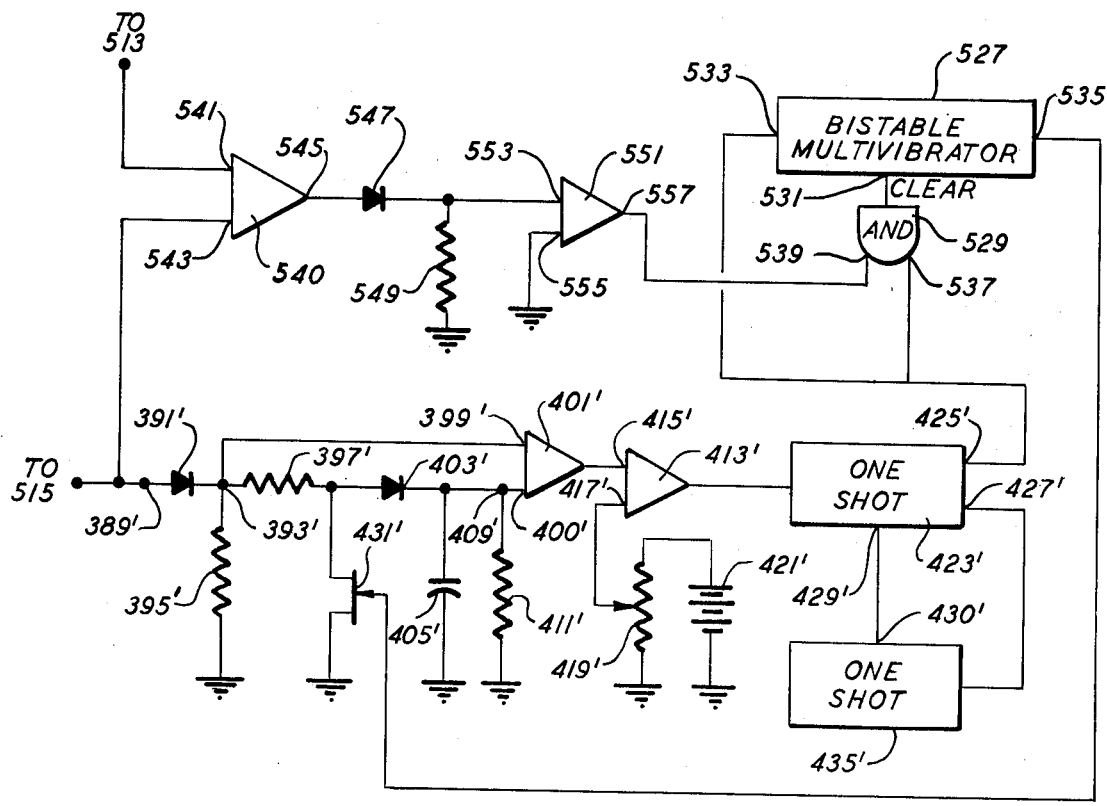
FIG. 20 illustrates a control unit for incorporation in the system of FIG. 19.

This is accomplished by adding some components to the control unit of FIG. 12. This modified control unit is illustrated in FIG. 20. Those elements that are common to FIG. 12 and FIG. 20 are ascribed the same numerical designation with a prime (') designation.

Comparing the control circuits of FIG. 12 and FIG. 20, it will be seen that the switch (385') is no longer operated directly by the blanking signal control means exemplified by monostable multivibrator (423'), but, rather, that 423' operates a blanking termination means in the form of a bistable multivibrator 527, which through output terminal 535 operates switch 385', which now can be simply a field effect transistor. Bistable multivibrator 527 has a CLEAR input terminal 531, connected to the output terminal of AND gate 529. AND gate 529 has one input terminal 537 connected to the output terminal 425' of ONE SHOT or monostable multivibrator 423'; and a second input terminal 539 connected to the output of filter unit 383' by virtue of the connection of a differential amplifier 540. The output terminal 545 of unit 540 is connected to a rectifier 547, a grounded resistor 549, a comparator 551, and thence to terminal 539 of gate 529.

To open switch 385', the CLEAR terminal 531 of bistable multivibrator 527 has to be activated. The CLEAR terminal receives its signal from AND gate 529. This is a reversing type of AND gate with the two inputs 537 and 539, and AND gate 529 puts out a signal only when both input signal voltages are zero. Thus, two criteria must be satisfied if the AND gate is to function to clear bistable multivibrator 527. The first of these criteria is that a predetermined time period such as one millisecond shall have passed since the institution of the blank. This is achieved by monostable multivibrator 423', as was heretofore disclosed in the description of the circuit of FIG. 12. The second criterion is that the instantaneous values of the input and the output of filter unit 383' (FIG. 19) should be equal. This is accomplished by the circuit that terminates at input 539 of the AND gate.

Differential amplifier 540 has two input terminals, 541 and 543. The latter derives its signal from the input terminal 515 to filter unit 383', and the other derives its signal from the output terminal 513 of filter unit 383'. Thus, the output of differential amplifier 540 is proportional to the difference in the instantaneous values of the voltage at the input and output of the filter unit. The output of the differential amplifier is connected to the full wave rectifier 547 and the output of rectifier 547 appears across resistor 549. The voltage across resistor 549 is applied to one input terminal 553 of comparator 551, the other input terminal 555 of which is grounded. Comparator 551 has the characteristic that, when an imbalance exists between its two inputs, it puts out a saturation voltage, which is applied to input 539 of AND gate 529. When the instantaneous values of the input and output voltages of filter 383' are equal, differential amplifier 540 has a zero output voltage, causing the rectified voltage appearing across resistor 549 to fall to zero, which causes the output of comparator 551 to become zero. At this time, if the signal at input terminal 537 of AND gate 529 is also zero, the AND gate will put out a signal voltage that will actuate the CLEAR mode of bistable multivibrator 527 to open switch 385' concluding the blank. Since there is at that instant no voltage drop across the filter unit, the conclusion of the blank will be inaudible.

Monostable multivibrator 435' functions to provide a delay of a predetermined time period such as five milliseconds between consecutive operations of the blanking switch 385', as previously disclosed in the description of the functioning of the circuit of FIG. 12. Switch 431' continues to perform the same function as it performed in the circuit of FIG. 12, but, in the circuit of FIG. 20, is actuated by the output signal of bistable multivibrator 527.

Figure 17:
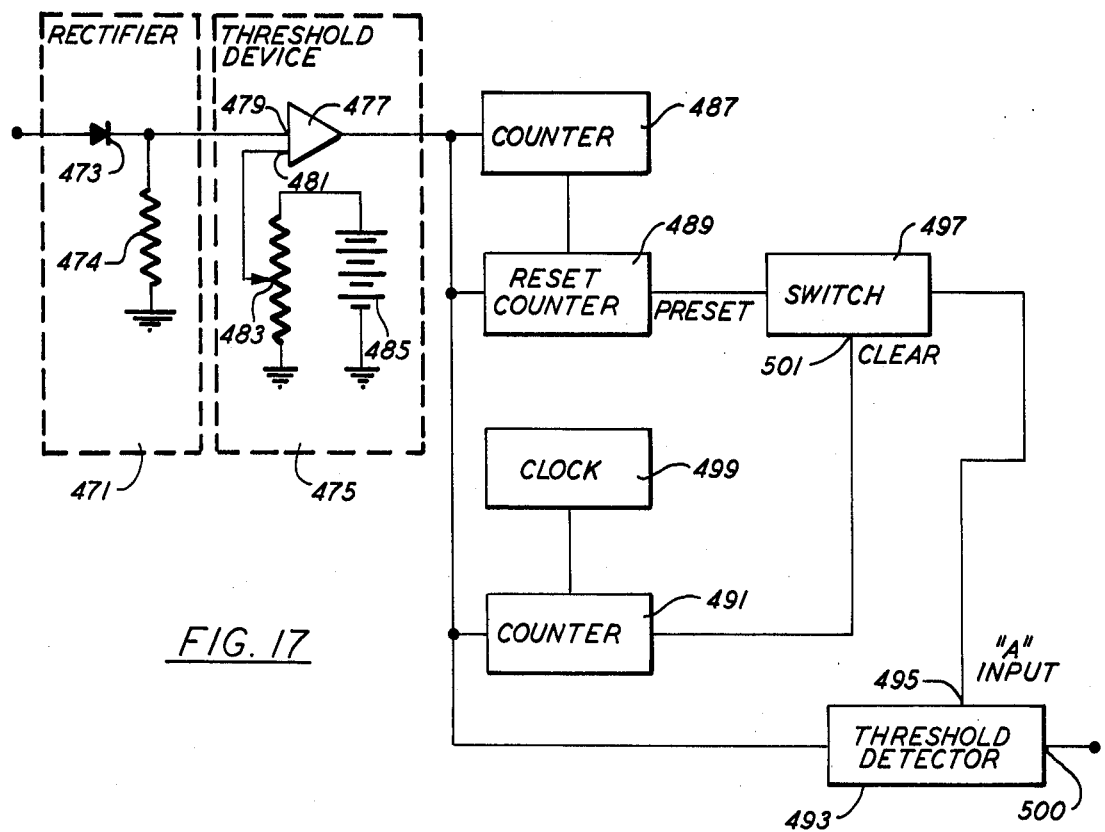
FIG. 17 illustrates an alternative control unit for use in the circuits of FIGS. 11 and 14.

The system in FIG. 11 shows a control unit 379 for operating switch 385. A like control unit is provided in the system shown in FIG. 14 for operating switches 451 and 455. An alternate device for operating the foregoing switches is shown in FIG. 17. The circuit shown in FIG. 17 may be characterized in that it discriminates between noise transients and signal transients by taking advantage of the characteristic of noise transients that they normally consist of one or a few pulsations of short duration (typically the sequence is less than one millisecond), whereas normal signal transients normally occur in sequences of 100 milliseconds or more in duration. The circuit in FIG. 17 distinquishes noise and signal transients by means of a timing and counting device.

The device in FIG. 17 is an alternate control unit as mentioned. The input to the device in FIG. 17 is connected to the output terminal of an amplifier corresponding to amplifier 377 in FIG. 11 and amplifier 377' in FIG. 15. A full wave rectifier 471 receives and rectifies the output signal from the foregoing amplifier. Rectifier 471 is symbolized by a diode 473 and a grounded resistor 474 connected to the output terminal of the diode. The output of rectifier 471 is applied to a threshold device 475. Threshold device 475 can advantageously comprise a comparator 477 having a first input terminal 479 connected to the output of rectifier 471, and a second input terminal 481 connected to a potentiometer or variable resistor 483 across which is applied a voltage from a voltage source 485. Potentiometer 483 serves as a sensitivity control for establishing the threshold value at which comparator 477 is triggered.

Rectifier 471 generates an output signal in the form of a positively polarized, fluctuating voltage which follows the instantaneous value of the input signal to the rectifier. When the voltage applied at terminal 479 of comparator 477 exceeds the threshold value established by the setting of potentiometer 483, comparator 477 generates an output voltage signal which serves as a blanking command. The output of threshold device 475 is applied to counters 487, 489, and 491 connected in parallel lines to the output terminal of the threshold device, and to a blanking signal control means in the form of a threshold detector 493 connected in a fourth parallel line.

Threshold detector 493 can be a monostable multivibrator of a type which generates an output signal for a predetermined period of time which is selected to equal the blanking time. An input terminal 495 is provided in the threshold detector through which a signal can be applied to selectively deactivate the threshold detector. The application of a signal to terminal 495 is controlled by a switch 497 as described below.

Referring now to the three counters, signal conclusion indicating means in the form of counter 487 is a timer and can be a monostable multivibrator. It generates a signal at a predetermined period of time after it is triggered such as, for the intended application of the device, 5 milliseconds. First counting means and deactivation terminating means in the form of counter 489 serves to count blanking commands, that is the output signals of threshold device 475. Numeral 499 designates a pulse generator or clock which is connected to counter 491. Counter 491 counts pulses received from the clock. Clock 499 can be a free running astable multivibrator which generates signals at regular intervals such as one per millisecond.

When a noise transient occurs and is applied to the input of rectifier 471, threshold device 475 generates an output signal or blanking command. The blanking command actuates threshold detector 493, whose output terminal 500 is applied to the switch which it operates (e.g., either switch 385 in FIG. 11, or switches 451 and 455 in the system of FIG. 14), and the blanking operation commences. Counter 489 commences to count the number of blanking commands, and counter 487 counts for a predetermined period such as 5 milliseconds. If counter 489 does not count a predetermined number of blanking commands within the time period of counter 487 (5 milliseconds), the transient is recognized as a noise transient, and counter 489 will not put out a signal. Counter 489 will be reset by the signal from counter 487 and will be ready to resume the counting of blanking commands when they arrive. On the other hand, if counter 489 does count more than the predetermined number of blanking commands within the counting period of counter 487, such as 12 or more blanking commands within the 5 millisecond period referred to, the detected transient signal is recognized as a normal signal transient whose retention is desired. Hence, since it is desired not to initiate any further blanking during that transient, counter 489 (functioning as de-activation termination means) is selected to have the characteristic that it delivers a trigger voltage to actuate switch 497, which in turn delivers a signal to terminal 495 of threshold detector 493 to in turn prevent the latter detector from responding to any further blanking commands from the threshold device. Switch 497 can take the form of a bistable multivibrator having a preset terminal connected to counter 489 and an output terminal connected to terminal 495 of the detector 493.

Threshold detector 493 should not be cleared until the transient which has been recognized as a normal signal transient such as a portion of a musical piece, has been concluded. In order to determine when the signal transient has concluded, counter 491 acts in conjunction with clock 499 to generate a "clear" signal at the appropriate time. Counter 491 receives blanking command signals from threshold device 475 at its input or reset terminal. Each time it receives a blanking command, it starts to count pulses received from clock 499 which are generated at a predetermined rate, such as one per millisecond as indicated earlier. Counter 491 continues to count each sequence of pulses until it receives another blanking command at which time it is reset and commences counting all over again. If counter 491 succeeds in counting a predetermined number of pulses such as twelve, it in effect receives a signal that no blanking command has been received for the predetermined period (e.g. 12 milliseconds), so that the normal signal transient is determined to have concluded. In response to having counted to the predetermined number, counter 491 generates a signal to a terminal 501 of switch 497, which is the clear terminal of the switch. This effects the termination of the signal transmitted by switch 497 to threshold detector 493, and the threshold detector is reset to trigger the switch which it controls upon the arrival of the next blanking command.

The timing sequence of the control unit shown in FIG. 17 can also be explained in the following manner. When a noise transient or loud signal transient occurs after a period that has been free of such transients, the following events occur:

(1) threshold device 475 delivers a blanking command that actuates threshold detector 493; this in turn actuates the appropriate switching device causing blanking to occur;

(2) counter 480 commences to count the number of blanking commands;

(3) counter 487 starts counting its predetermined time period (5 milliseconds);

(4) if counter 489 does not count at least the predetermined number of blanking commands (12 in this example) within the predetermined time period of counter 487 (5 milliseconds), the transient is recognized as a noise transient and counter 487 emits a pulse to reset counter 489;

(5) if counter 489 does count at least the predetermined number of blanking commands (12 or more) within the time period of counter 487 (5 milliseconds), the transient is recognized as a signal transient and thus no further blanking occurs for the duration of the signal transient. To accomplish the foregoing, after counting the predetermined number of blanking commands counter 489 delivers a trigger voltage to the PRESET terminal of switch 497; this causes switch 497 to apply a signal to the A INPUT of threshold detector 493, and thus prevents device 493 from responding to any blanking commands. Threshold detector 493 is not cleared until the signal transient is recognized as having concluded.

Figure 18:
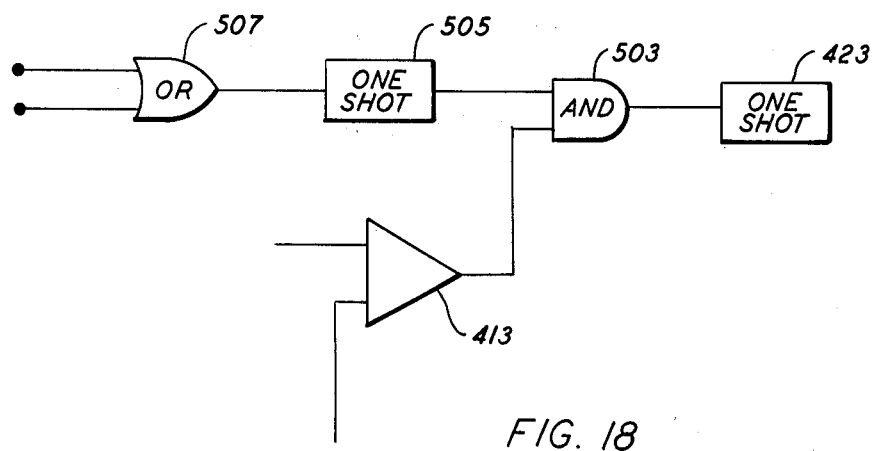
FIG. 18 is a schematic diagram of further components which can be incorporated in the circuit of FIG. 12.

A further refinement to the control unit used in the blanking system of FIG. 11 is shown in FIG. 18. FIG. 18 shows a modification to the basic blanking system for discriminating between the normal signal transients which are to be retained and noise transients. This refinement involves the interposing in FIG. 12 of an AND gate 503 having one input terminal connected to comparator 413 (FIG. 12) and another input terminal connected to a monostable multivibrator 505. The output of AND gate 503 is connected to multivibrator 423 in FIG. 12. Multivibrator 505 generates an output signal of a predetermined period such as five microseconds whenever the switching device (FIG. 1) detects a transient. Thus, two criteria must be satisfied before blanking can occur: both the switching circuit of FIG. 1, and the blanking circuit of FIG. 11, must register the presence of a transient which corresponds to the criteria for the operation of each device.

In order to establish the foregoing two criteria, the output terminals 37 and 39 of control unit 19 in FIG. 1 (or terminals 83 and 85 in FIG. 2) are connected to the two inputs of an OR gate 507. The output terminal or OR gate 507 is connected to monostable multivibrator 505 which is in turn connected to AND gate 503. OR gate 507 generates an output signal whenever the control unit generates a switching command to the switches under its control (such signals are generated when noise transients occur in either channel 1 or channel 2). An output signal from gate 507 triggers multivibrator 505, which in turn generates a signal for a predetermined period such as five microseconds. It will be recalled that differential amplifier 413 generates a signal whenever a transient is detected which meets the blanking criteria. With the modification shown in FIG. 18, the output of this differential amplifier is applied to AND gate 503. The signal from amplifier 413 does not automatically effect the switch 385 in FIG. 11 as described earlier, but rather, only closes that switch when multivibrator 505 contemporaneously generates a signal indicative that a noise transient has been detected.

As a further modification to the system shown in FIG. 18, AND gate 503 could be replaced with a different AND gate having three input terminals, the additional input being a command from the circuit in FIG. 17, transmitted through a connection between the output terminal 500 of threshold detector 493 and the added input terminal. Also, AND gate 503 could be replaced by an OR gate so that multivibrator 423 could operate on either a blanking command from device 413 or from device 505.

The preceding embodiments of the invention accomplish the objects set forth above. The various embodiments of the invention effectively eliminate or suppress noise transients from carrier signals, particularly sound signals, in a practicable and efficient manner.

The invention has been described in detail with particular emphasis on the preferred embodiments, but it will be understood that variations and modifications within the spirit and scope of the invention may occur to those skilled in the art to which the invention pertains.

We claim:

1. A system for enabling only the transmission of a carrier signal having the lowest instantaneous noise transient level in the transmitted portion of identical electrical carrier signals of substantially equal signal strength having differing noise transients and transmitted synchronously and simultaneously over separate channels, the existence of such noise tansients being reflected by differences in the instantaneous magnitudes between said carrier signals, said system comprising:

comparing means connectable to said channels for continuously comparing the total instantaneous signal-plus-noise magnitude of said carrier signals, and actuable in response to the existence of a noise transient in any of said carrier signals for enabling only the transmission of the carrier signal having the lowest instantaneous noise transient level.

2. The invention according to claim 1 wherein said comparing means comprises:

first control means connectable to said channels for generating switching signals indicative of the channel carrying the carrier signal having the lowest instantaneous transient noise level; and enabling means connected to said first control means, and actuable in response to said switching signals to enable only the channel carrying the signal having the lowest transient noise level to transmit the carrier signal.

3. The invention according to claim 2 and further including:

low frequency mixing means connectable between said channels for mixing equally into all of said channels all signal components having frequencies below a predetermined frequency level.

4. The invention according to claim 2 wherein the system includes first and second channels for transmitting said identical electrical carrier signals, and said first control means comprises:

first rectifying means connectable to said first channel for generating first rectified signals of one polarity corresponding to signals transmitted by said first channel;

second rectifying means connectable to said second channel for generating second rectified signals opposite in polarity to said first rectified signals, and corresponding to signals transmitted by said second channel; and polarity determining means connected to said first and second rectifying means, for combining said first and second rectified signals and for determining the polarity of the combined rectified signals, and for generating said switching signals according to said polarity.

5. The invention according to claim 4 wherein said first and second rectifying means each comprises full wave rectifiers having opposite polarities, for respectively producing pulsating wave forms opposite in polarity corresponding to the signals transmitted by said first and second signals.

6. The invention according to claim 4 and further including first and second high pass filter means connected to said first and second rectifying means respectively, for eliminating from transmission through said first control means, signal transients having frequencies below a predetermined level.

7. The invention according to claim 4 and further comprising threshold means for establishing a threshold value corresponding to a predetermined difference in noise level between the respective channels and for preventing the generation of said switching signals when the absolute magnitude of the difference between the combined rectified signals is less than said threshold value.

8. The invention according to claim 2 wherein the channels include first and second channels for transmitting said identical carrier signals, and said first control means comprises:

first rectifying means connectable to said first channel for generating first rectified signals of one polarity corresponding to signals transmitted by said first channel;

second rectifying means connectable to said second channel for generating second rectified signals opposite in polarity to said first rectified signals, and corresponding to signals transmitted by said second channel;

interconnecting means for interconnecting said first and second channels, for combining said first and second rectified signals to generate a net signal having a polarity corresponding to the polarity of said first or second rectified signal greatest in absolute value;

first differentiating means having first and second inlet terminals, the first of said inlet terminals being connected to said first and second rectifying means, and outlet terminal means;

second differentiating means having first and second inlet terminals, the latter first and second inlet terminals corresponding to the first and second inlet terminals of said first differentiating means but being opposite in polarity to the terminals to which said inlet terminals of said second differentiating means correspond; said first inlet terminal of said second differentiating means being connected to said first and second rectifying means, and outlet terminal means;

means for impressing a potential across each of said second inlet terminals opposite in polarity to the polarity of the signal received by said respective inlet terminals;

selecting means connected to the outlet terminal means of each of said differentiating means and actuable for effecting actuation of said comparing means; and said first and second differentiating means respectively generating actuation signals to actuate said selecting means when the net signal generated by said interconnecting means is both of the same polarity as the polarity impressed across the respective first inlet terminals of said first or second differentiating means, and exceeds the potential impressed across the respective second inlet terminals of said first or second differentiating means.

9. The invention according to claim 8 wherein said selecting means is a bistable multivibrator which assumes first or second stable states according to the respective one of said first and second differentiating means which generates said actuation signals, said bistable multivibrator actuating said enabling means to enable one of the channels to transmit the carrier signal according to the stable state assumed by said bistable multivibrator.

10. The invention according to claim 1 and further including means for equalizing the components of said signals having frequencies below a predetermined low frequency, and wherein said comparing means compares only noise transients in said carrier signals above said predetermined low frequency.

11. The invention according to claim 10 wherein said equalizing means comprises a low frequency mixer connectable between said channels, said mixer including resistor means connectable in each of said channels, and capacitor means interconnecting said resistor means.

12. The invention according to claim 1 and further including:

summing means connectable to said channels for receiving and combining the respective carrier signals;

and wherein said comparing means comprises means connectable to said channels and to said summing means, and actuable for enabling the one of said channels and said summing means having the lowest transient noise level to transmit the signal carried thereby, and for disabling the other of said channels and said summing means from transmitting the signals carried thereby.

13. The invention according to claim 12 wherein said comparing means comprises first comparing means and second comparing means, said first comparing means comprising:
- first control means connectable to said channels for generating first switching signals indicative of the channel carrying the carrier signal having the lowest transient noise level; and
- first enabling means connected to said first control means, and actuable in response to said first switching signals to enable only the channel having the lowest transient noise level to transmit the carrier signal;

and said second comparing means comprising:
- second control means connected to said channels and to said summing means, said second control means generating a second switching signal indicative of which of either of said channels or of said summing means is carrying the signal having the lowest transient noise level; and
- second enabling means connected to said second control means and actuable in response to said second switching signals to enable only the one of said channels and said summing means carrying the signal having the lowest transient noise level, to transmit such latter signal having the lowest transient noise level.

14. The invention according to claim 1 and further including:
- summing means connectable to said channels for receiving the respective carrier signals and for generating a combined signal;
- and wherein said comparing means is further connected to said summing means, said comparing means enabling only the one of the channels carrying the signal having the lowest transient noise level and of said summing means, carrying the signal having the lowest transient noise level to transmit the signal carried thereby.

15. The invention according to claim 14 wherein said comparing means comprises:
- first control means connectable to said channels for generating first switching signals indicative of the channel carrying the carrier signal having the lowest transient noise level;
- first enabling means connected to said first control means, and actuable in response to said first switching signals to enable only the channel having the lowest transient noise level to transmit the carrier signal;
- second control means connectable to said channels and to said summing means, said second control means generating a second switching signal indicative of the one of said channels and of said summing means carrying the signal having the lowest transient noise level; and
- second enabling means connected to said second control means, and actuable in response to said second switching signals to enable only the one of said channels and of said summing means carrying the signal having the lowest transient noise level, to transmit such latter signal having the lowest transient noise level.

16. The invention according to claim 15 wherein the system includes first and second channels for transmitting said identical electrical carrier signals; and said second control means comprises:
- first rectifying means connectable to said first channel for generating first rectified signals of one polarity corresponding to signals transmitted by said first channel; and
- second rectifying means connectable to said second channel for generating second rectified signals having the same polarity as said first rectified signals, and corresponding to signals transmitted by said second channel;
- third rectifying means connected to said summing means for generating third rectified signals opposite in polarity to said first and second rectified signals, and corresponding to the combined signal generated by said summing means;
- first polarity determining means for combining said first and third rectified signals and for determining the polarity of the combined first and third rectified signals, and for generating a first switching signal indicative of the one of said first channel and of said summing means carrying the signal having the lowest transient noise level; and
- second polarity determining means for combining said second and third rectified signals and for determining the polarity of the combined second and third signals, and for generating a second switching signal indicative of the one of said second channel and of said summing means carrying the signal having the lowest transient noise level;

and wherein said comparing means further comprises third enabling means connected to said second control means for enabling the system to transmit only the carrier signal having the lowest transient noise level as determined by said first control means when said first switching signal and said second switching signal indicate that the signal carried by either of said first and second channels has a lower transient noise level than said combined signal, and for enabling the system to transmit only said combined signal when said first switching signal and said second switching signal indicate that said combined signal has a lower transient noise level than the signal carried by either of said first and second channels.

17. The invention according to claim 16 wherein said first and second polarity determining means each further include threshold means for establishing a threshold value and for preventing the generation of said first or said second switching signals when the absolute magnitude of the difference between said respective combined rectified signals is less than said threshold value.

18. The invention according to claim 14 wherein said comparing means comprises:
- first control means connectable to said channels and actuable for generating first switching signals indicative of the channel carrying the carrier signal having the lowest transient noise level;
- first enabling means connectable to said first control means, and actuable in response to said first switching signals to enable only the channel having the lowest transient noise level to transmit the carrier signal;
- second control means connectable to said channels and to said summing means, said second control means generating a channel switching signal when any one of said channels is carrying a carrier signal having a lower transient noise level than the noise transient level in the combined signal, and a summing switching signal when said summing means is carrying a combined signal having a noise transient level lower than the noise transient level on any of said carrier signals at a corresponding time;

outlet means for transmitting an output signal from the system;

second enabling means connected to said second control means and actuable in response to signals generated by said second control means for selectively enabling only the channel carrying the carrier signal having the lowest transient noise level as indicated by said first control means to transmit such carrier signal to said outlet means in response to said channel switching signal, and for selectively enabling only said summing means to transmit the combined signal to said outlet means in response to said summing switching signal.

19. The invention according to claim 18 wherein said system includes first and second channels, and said second control means comprises:
means for comparing the carrier signals carried by each of said channels with said combined signal, and for generating signals indicating whether the carrier signal carried by either of said channels has a transient noise level lower than the transient noise level of the combined signal; and a bistable multivibrator for generating said channel switching signal when one of said channels is carrying a carrier signal having a lower transient noise level, and for generating said summing switching signal when the combined signal has a lower transient noise level than either of said carrier signals.

20. The invention according to claim 1 wherein a pair of said channels each include amplifying means for amplifying the respective carrier signals on the channels, and wherein said system further includes balance control means for balancing the respective carrier signal voltages on the pair of channels, said balance control means comprising:
imbalance sensor means for monitoring the carrier signal voltages in the respective channels, and for generating imbalance signals in response to the sensing of an imbalance in the magnitude of the voltages of the respective monitored carrier signal voltage; and
gain adjusting means connected to said imbalance sensor means and to at least one of said amplifiers to adjust the respective gains of said at least one amplifiers in response to the reception of said imbalance signals.

21. The invention according to claim 20 and further including:
first rectifying means connectable to a first one of said pair of channels for generating first rectified signals of one polarity corresponding to signals transmitted by said first channel;
second rectifying means connectable to a second one of said pair of channels for generating second rectified signals opposite in polarity to said first rectified signals, and corresponding to signals transmitted by said second channel; and
combining means for combining said first and second rectified signals, to generate a net signal having a polarity corresponding to the polarity of the one of said first or second rectified signal greatest in absolute value and an electric potential corresponding to the net electric potential of said combined signals;

and wherein said imbalance sensor means comprises an electric lamp electrically connected to said net signal generating means for emitting a gain control illumination signal proportionate in intensity to the value of said net signal;

and wherein said gain adjusting means comprises photosensitive gain control means electrically connected to at least one of said amplifier means for adjusting said amplifier means in response to said gain control illumination signal, to adjust the gains of said amplifier means towards an equal value.

22. The invention according to claim 21 wherein said balance control means further comprises low pass filter means for filtering from said carrier signals those signal components having frequencies above a predetermined value corresponding to the frequency of noise transients in said carrier signals.

23. The invention according to claim 1 wherein said comparing means comprises:
first control means connectable to said channels for generating switching signals indicative of the channel carrying the carrier signal having the lowest transient noise level; and
first enabling means connected to said first control means, and actuable in response to said switching signal to enable only the one channel carrying the signal having the lowest transient noise level to transmit the carrier signal; and
wherein said system further comprises:
blanking means connectable to said one channel for blanking a predetermined portion of the carrier signal transmitted by said one channel;
second enabling means electrically connected to said blanking means and actuable for selectively enabling said blanking means to perform the blanking function;
second control means electrically connected to said second enabling means and to said one channel for detecting noise transients in the carrier signal transmitted by said one channel, and for generating actuating signals to actuate said second enabling means in response to the detection of a noise transient.

24. The invention according to claim 1 wherein said comparing means comprises:
first control means connectable to said channels for generating switching signals indicative of the presence of a noise transient having an amplitude above a predetermined value in the carrier signal; and
first enabling means connected to said first control means, and actuable in response to said switching signal to enable only the one channel carrying the signal having the lowest transient noise level to transmit the carrier signal; and
wherein said system further comprises:
blanking means connected to said channels for blanking a predetermined portion of the carrier signal transmitted by said one channel;
second enabling means electrically connected to said blanking means and actuable for selectively enabling said blanking means to perform the blanking function;
second control means electrically connectable to said channels for detecting noise transients in the carrier signal transmitted by said one channel, and for generating blanking control signals in response to the detection of a noise transient;

third control means electrically connected to said second enabling means and actuable for actuating said second enabling means;

fourth control means electrically connected to said first, second and third control means, for actuating said third control means in response to the simultaneous occurrence of said switching signals and said blanking control signals.

25. The invention according to claim 24 wherein said fourth control means further includes means for actuating said third control means in response to the occurrence of either said switching signals or said blanking control signals.

26. A system for reducing the noise transients in a carrier signal transmitted over a channel, said system comprising:

blanking means for blanking a predetermined portion of the carrier signals;

enabling means electrically connected to said blanking means and actuable for selectively disabling said blanking means from performing the blanking function or for enabling said blanking means to perform the blanking function; and control means electrically connectable to said channel for detecting noise transients in said carrier signal and to said enabling means, said control means comparing the instantaneous signal-plus-noise in said carrier signal with a predetermined value which is a function of said signal and detecting a noise transient when the instantaneous magnitude of said carrier signal exceeds said predetermined value, for generating actuating signals to actuate said enabling means to perform the blanking function in response to the detection of a noise transient.

27. The invention according to claim 26 wherein said control means comprises:

instantaneous voltage generation means for transmitting a first signal reflective of the instantaneous voltage of the carrier signal;

peak voltage generation means for generating and transmitting a second signal reflective of the average peak voltage of said first signal over a predetermined time period;

differentiating means electrically connected to said instantaneous voltage generation means and to said peak voltage generation means, for generating a noise indicator signal when said first signal exceeds said second signal to indicate the occurrence of a noise transient;

reference means for establishing a predetermined threshold voltage;

comparing means electrically connected to said differentiating means and to said reference means for generating a blanking signal when said noise indicator signal voltage exceeds said predetermined threshold voltage; and means for connecting said comparing means to said enabling means, for actuating said enabling means in response to said blanking signal.

28. The invention according to claim 27 and further comprising:

blanking signal control means electrically connected to said comparing means for generating a switching signal for a predetermined blanking period in response to said blanking signal, said blanking signal control means being electrically connected to said enabling means for actuating said enabling means for said blanking period in response to the occurrence of said switching signal.

29. The invention according to claim 28 and further comprising:

disabling means electrically connected between said blanking signal control means and said peak voltage generation means, for disabling said peak voltage generation means from generating and transmitting said second signal for said blanking period, in response to the generation of said blanking signal.

30. The invention according to claim 29 and further comprising:

second disabling means electrically connected to said blanking signal control means for disabling said blanking signal control means from generating one of said switching signals for a predetermined length of time, in response to the commencement of said blanking period.

31. The invention according to claim 28 wherein said enabling means comprises:

switch means electrically connected to said blanking signal control means and to said blanking means, and actuable from a deactive condition in response to the occurrence of a blanking signal to enable said blanking means to perform the blanking function; and delay means electrically connected to said switch means and to said blanking signal control means for impeding the deactivation of said switch means from the actuating condition after termination of a switching signal generated by said blanking signal control means, whereby said blanking function terminates gradually after the termination of said switching signal.

32. The invention according to claim 31 wherein said delay means comprises:

variable resistor means connected across said switch means, and having a normally high resistance; and resistance control means for decreasing the resistance of said variable resistor means to a low value during a switching signal from said blanking signal control means, and for gradually increasing the resistance of said variable resistor means after termination of the switching signal.

33. The invention according to claim 32 wherein said variable resistor means comprises photoresistor means whose resistance is inversely proportionate to the intensity of illumination, and a light source energizable by said blanking signal control means in response to a blanking signal, for illuminating said photoresistor during the blanking period, said illumination gradually decreasing upon termination of the blanking period.

34. The invention according to claim 26 wherein system has input and output terminals and said enabling means comprises:

a first electrical path between said input and output terminals, said blanking means being in said first electrical path;

first switching means for connecting said blanking means to said output terminal in response to the generation of an actuation signal by said control means;

differentiating means connected to said blanking means for generating a differential signal corresponding to the voltage difference across said blanking means;

sample and hold means connected between said differentiating means and said output terminal;

second switching means actuable for connecting said differentiating means to said sample and hold means in response to the generation of an actuation signal by said control means, said sample and hold means charging to the value of said differential signal in response to the actuation of said second switching means;

said first and second switching means disconnecting said blanking means and said differentiating means from said output terminal in response to termination of said actuation signal, and said sample and hold means gradually discharging an output signal to said output terminal in response to the disconnection of said sample and hold means from said differentiating means gradually to terminate the effect on the carrier signal by said blanking function.

35. The invention according to claim 34 wherein said sample and hold means comprises parallel connected capacitance means and resistor means.

36. The invention according to claim 26 wherein said control means is further connected to said blanking means, and said control means commences the generation of actuating signals in response to the detection of said noise transients, and said control means terminates the generation of an actuating signal after both a predetermined period after the commencement of a detected noise transient, and after the instantaneous signal voltage difference across said blanking means becomes below a predetermined value.

37. The invention according to claim 36 wherein said control means comprises:

instantaneous voltage transmission means for transmitting a first signal reflective of the instantaneous voltage of the carrier signal;

peak voltage generation means for generating and transmitting a second signal reflective of the average peak voltage of said first signal over a predetermined time period;

differentiating means electrically connected to said instantaneous voltage generation means and to said peak voltage generation means, for generating a noise indicator signal when said first signal exceeds said second signal to indicate the occurrence of a noise transient;

threshold voltage means for establishing a predetermined voltage;

comparing means electrically connected to said differentiating means and to said threshold means, for generating a blanking signal when the voltage of said noise indicator signal exceeds said threshold voltage;

blanking signal control means electrically connected to said comparing means for generating a switching signal for a predetermined blanking period in response to said blanking signal, said blanking signal control means being electrically connected to said enabling means for actuating said enabling means for said blanking period in response to the occurrence of said switching signal;

blanking termination means electrically connected to said blanking means and to said blanking signal control means and to said enabling means, for deactivating said enabling means a predetermined perod of time after the generation of a particular control signal and when the instantaneous voltage drop across said blanking means is below a predetermined low voltage level, whereby the deactivation of said enabling means has no audible effect.

38. The invention according to claim 37 wherein said blanking termination means comprises:

differentiating means connected to said blanking means for generating a blanking means voltage drop signal reflective of the voltage drop across said blanking means;

means for establishing said predetermined low voltage level;

voltage drop comparing means connected to said differentiating means and to said means for establishing said predetermined low voltage level, for comparing said voltage drop signal with said predetermined low voltage level, said voltage drop comparing means generating a low difference signal when the difference between said voltage drop signal and said predetermined low voltage level is less than a predetermined amount; and bistable multivibrator means connected to said voltage drop comparing means and to said blanking signal control means, for deactivating said enabling means in response to the termination of said switching signal and to said low difference signal.

39. The invention according to claim 26 wherein said control means comprises:

threshold determining means electrically connectable to said channel for generating blanking command signals when the amplitude of the carrier signal exceeds a predetermined threshold value corresponding to the amplitude of a noise transient;

blanking signal control means electrically connected to said threshold determining means for actuating said enabling means in response to a blanking command signal;

timing means electrically connected to said threshold determining means for measuring the repetition rate of individual blanking command signals, and for generating a de-activation signal when the repetition rate of individual command signals is less than a certain amount in a first predetermined time period corresponding to the duration of non-noise components of the carrier signal; and switch means connected to said timing means and to said blanking signal control means, for de-activating said blanking signal control means in response to said de-activation signal.

40. The invention according to claim 39 wherein said timing means comprises:

signal conclusion indicating means electrically connected to said threshold determining means for generating conclusion signals for said first predetermined time period, in response to the conclusion of a blanking command signal; and first counting means electrically connected to said threshold determining means and to said signal conclusion indicating means and to said switch means, for generating said de-activation signals when the number of any of said blanking command signals within the first predetermined time period exceeds a predetermined quantity.

41. The invention according to claim 40 wherein said timing means further comprises:

de-activation termination means electrically connected to said threshold determining means and to said switch means for terminating the de-activation of said blanking signal control means by said switch means after the duration of blanking command signals caused by non-noise components of the carrier signal.

42. The invention according to claim 41 wherein said de-activation signal terminating means comprises:
second timing means connected to said threshold determining means and to said switch means for comparing the time interval between successive blanking command signals with a predetermined time period, and for performing said termination function when the time interval between blanking command signals exceeds said predetermined time period.

* * * * *